United States Patent
Kumai et al.

(10) Patent No.: US 9,478,674 B2
(45) Date of Patent: Oct. 25, 2016

(54) METHOD OF MANUFACTURING A CIRCUIT BOARD BY PUNCHING

(71) Applicant: DSM IP ASSETS B.V., Heerlen (NL)

(72) Inventors: Koichi Kumai, Tokyo (JP); Ryuji Ueda, Kitakatsushika (JP); Kentaro Kubota, Kasukabe (JP); Shigeki Kudo, Kasukabe (JP); Minoru Kawasaki, Tokyo (JP)

(73) Assignee: DSM IP ASSETS B.V., Heerlen (NL)

( * ) Notice: Subject to any disclaimer, the term of this patent is extended or adjusted under 35 U.S.C. 154(b) by 539 days.

(21) Appl. No.: 13/896,853

(22) Filed: May 17, 2013

(65) Prior Publication Data

US 2013/0247977 A1 Sep. 26, 2013

Related U.S. Application Data

(63) Continuation of application No. PCT/JP2011/076650, filed on Nov. 18, 2011.

(30) Foreign Application Priority Data

Nov. 19, 2010 (JP) .................................. 2010-259186
Mar. 28, 2011 (JP) .................................. 2011-069309
Jun. 6, 2011 (JP) .................................. 2011-126519

(51) Int. Cl.
*H05K 3/02* (2006.01)
*H01L 31/02* (2006.01)
(Continued)

(52) U.S. Cl.
CPC ..... *H01L 31/02021* (2013.01); *H01L 31/0516* (2013.01); *H05K 1/02* (2013.01);
(Continued)

(58) Field of Classification Search
CPC .......... H05K 3/20; H05K 3/202; H05K 1/02; H05K 2201/10143; H05K 2203/0221; H05K 2203/033; H05K 2203/1545; H01L 31/02021; H01L 31/0516; Y10T 156/1002; Y10T 29/49126; Y10T 29/49128; Y10T 29/49155; Y02E 10/50
USPC .................. 29/830, 831, 846, 847; 174/259; 156/233, 248, 251, 261; 235/492
See application file for complete search history.

(56) References Cited

U.S. PATENT DOCUMENTS 3,990,142 A * 11/1976 Weglin .................... B21D 28/14
29/848
7,930,822 B2 * 4/2011 Nakanishi .............. H05K 3/046
29/830
8,162,231 B2 * 4/2012 Ogata .............. G06K 19/07722
235/492

FOREIGN PATENT DOCUMENTS

| CN | 1304281 | 7/2001 |
|---|---|---|
| CN | 101573775 | 11/2009 |

(Continued)

OTHER PUBLICATIONS

Office Action mailed Aug. 19, 2014 for corresponding Japanese Patent Application No. 2010-259186.
(Continued)

*Primary Examiner* — Donghai D Nguyen
(74) *Attorney, Agent, or Firm* — Nixon & Vanderhye P.C.

(57) ABSTRACT

A method of manufacturing a circuit board includes: forming a plurality of metal electrodes so as to be separated from each other on a holding sheet by cutting a metal foil held on the holding sheet to remove a portion of the metal foil; forming adhesive layers on surfaces of the plurality of metal electrodes; adhering the adhesive layers to a base material by closely contacting the adhesive layers with the base material; and transcribing the adhesive layers and the plurality of metal electrodes onto the base material by detaching the holding sheet from the plurality of metal electrodes.

4 Claims, 17 Drawing Sheets

(51) Int. Cl.
*H05K 3/20* (2006.01)
*H05K 1/02* (2006.01)
*H01L 31/05* (2014.01)

(52) U.S. Cl.
CPC .............. *H05K 3/20* (2013.01); *H05K 3/202* (2013.01); *H05K 2201/10143* (2013.01); *H05K 2203/0221* (2013.01); *H05K 2203/033* (2013.01); *H05K 2203/1545* (2013.01); *Y02E 10/50* (2013.01); *Y10T 29/49156* (2015.01); *Y10T 156/1002* (2015.01)

(56) References Cited

FOREIGN PATENT DOCUMENTS

| CN | 101647095 | 2/2010 |
|---|---|---|
| CN | 101874305 | 10/2010 |
| JP | 57-1700 | 1/1982 |
| JP | 3-82195 | 8/1991 |
| JP | 3116209 | 10/2000 |
| JP | 2005-339518 | 12/2005 |
| JP | 2007-76288 | 3/2007 |
| JP | 2009-88145 | 4/2009 |
| JP | 2011-61151 | 3/2011 |
| TW | 404092 | 9/2000 |

OTHER PUBLICATIONS

International Search Report mailed Mar. 6, 2012 in corresponding International Application No. PCT/JP2011/076650.
Office Action mailed Apr. 1, 2015 for corresponding Japanese Patent Application No. 2011-126519.
Chinese Office Action dated Jun. 2, 2015 in corresponding Chinese Patent Application No. 201180054919.3.
Taiwanese Office Action dated Apr. 11, 2016 in corresponding Taiwanese Patent Application No. 100142220.

\* cited by examiner

METHOD OF MANUFACTURING A CIRCUIT BOARD BY PUNCHING

CROSS-REFERENCE TO RELATED APPLICATIONS

This is a continuation application, filed under 35 U.S.C. §111(a), of International Application PCT/JP2011/076650, filed Nov. 18, 2011, which designated the United States and was published in a language other than English, and which claims the benefit of Japanese Patent Application No. 2010-259186, filed Nov. 19, 2010, Japanese Patent Application No. 2011-069309, filed Mar. 28, 2011, and Japanese Patent Application No. 2011-126519, filed Jun. 6, 2011, all of them are incorporated by reference herein. The International Application was published in Japanese on May 24, 2012 as WO2012/067225 A1 under PCT Article 21(2).

BACKGROUND

1. Field

The present invention relates to a circuit board, a method for manufacturing the same, and a solar cell module. The present invention also relates to a metal foil pattern that is patterned into any shapes by cutting with a blade portion of a metal mold, and a method for punching a metal foil for manufacturing the metal foil pattern. In addition, the present invention relates to a metal foil pattern laminate in which a metal foil pattern that is patterned in any shape by cutting with a blade portion of a metal mold is provided on a base material, and a method of punching a metal foil to manufacture the metal foil pattern laminate.

2. Description of the Related Art

When forming a conductive pattern such as circuit, wiring or the like on a substrate, a conductive pattern is mostly formed by forming a metal thin film on a substrate, and then removing an unnecessary portion of the metal thin film by photo-etching and the like.

Since such a manufacturing method requires many steps, in recent years, sometimes a conductive pattern is formed by adhering a metal foil sheet on a substrate, and then punching the metal foil with a punching blade.

For example, the Patent Document 1 (Japanese Unexamined Patent Application, First Publication No. 2007-76288) describes a method for forming a conductive pattern as an RFID antenna by layering a metal foil sheet, which has a metal foil and an adhesive layer, and a base material; performing punching and temporal fixation of the metal foil sheet with a heated punching blade; and removing an unnecessary portion with an aspirating machine or the like.

Corrosion processes by etching have been utilized to form metal foil patterns of any shape from large area metal foils. In this procedure, an etching-resistant resist material and the like is patterned on a metal foil, and then a portion of the metal foil not having a resist material can be removed by immersing the patterned metal in an etchant and the like. In this procedure, however, patterning of a resist material becomes difficult as an area of a metal foil becomes large. In addition, because a large volume of etchant is used to corrode a metal foil, a large amount of money is required to prepare corresponding equipment, to implement measures for protection of the environment, and the like.

As another patterning method for a metal foil to solve the problem, for example, the Patent Document 2 (Japanese Patent No. 3116209) describes a punching process by using a blade portion of a metal mold. Durability, shape accuracy, and processing area are varied depending on the kind of metal molds; however in recent years, fine patterns such as those of a few hundred micrometers can be formed since the precision of metal molds have increased and metal molds have been able to fit in a large processing area.

When punching a metal foil by the metal mold described above, the durability of the metal mold is a matter of concern. In particular, when punching a metal foil using a blade portion whose tip is formed to have an acute angle, the blade portion tends to be deteriorated. Then, a half-cut process is usually performed to increase the durability of the metal mold. In this process, a metal foil and a cushioning material are punched at the same time, and a tip of a blade portion is pressed from the metal foil-side, and then stopped on a middle portion in the thickness direction of the cushioning material. Accordingly, a tip of the blade portion can be prevented from becoming dull. In addition, by using an adhesive film as a cushioning material, misalignment of the metal foil can be prevented, and thereby a pattern with high-precision can be formed.

Note that although the adhesive film is necessary for the half-cut process to prevent misalignment, it is usually disposed after each time a metal foil is punched.

SUMMARY

However, the method for forming a conductive pattern by punching a metal foil sheet and a substrate having the conductive pattern manufactured by the method have the following problems.

Figures of the Patent Document 1 illustrate that an adhesive layer seems to be completely removed; however, to form a conductive pattern by removing a metal foil in an unnecessary portion and an adhesive layer on a rear-side of the metal foil with an aspiration machine after punching a metal foil sheet, it is necessary to make sure that not only a metal foil sheet, but also an adhesive layer is completely cut in a punching step. To this end, a punching blade should be cut into a substrate that is below an adhesive layer. In this case, a sharp surface scratch corresponding to a conductive pattern made by a punching blade remains on a substrate. Accordingly, a substrate tends to be broken when external force is applied, and thereby durability will decrease. When a substrate is a thin-walled resin sheet, the durability, in particular, will be decreased.

Accordingly, a punching blade should be stopped within an adhesive layer to protect a substrate from a scratch that will be made by a punching blade, and thus it is difficult to completely cut an adhesive layer. Moreover, not only an adhesive layer between metal foils, but also metal foils that are needed to form a conductive pattern will be removed by aspiration. Therefore, it is also difficult to completely remove an adhesive layer between metal foils by aspiration.

When an adhesive layer remains between metal foils that are adjacent each other, weak electric current passes between metal foils through an adhesive layer on a substrate, and thereby the adhesive layer tends to deteriorate as time passes, and then a so-called migration that may cause a short circuit occurs. Accordingly, the durability and reliability are decreased.

As a result, in a solar cell module, which is required to continuously be used for a long time period, for example 10-50 years, it cannot be used for a wiring substrate and the like that electrically connects solar cells to each other.

When punching a metal foil on an adhesive film described above, a region which does not require the metal foil that is an unnecessary portion of the metal foil needs to be removed from an adhesive film after punching. When a region which does not require the metal foil integrally exists on an adhesive film, all of the unnecessary portion can be detached by winding.

However, when a region which does not require the metal foil discontinuously exists on an adhesive film, i.e., when a plurality of regions which do not require the metal foil exist on an adhesive film separated from each other, the entire region which does not require the metal foil cannot be easily removed from the adhesive film. In particular, when metal foil patterns are manufactured in a large scale, it is difficult to remove regions which do not require the metal foil that exist in areas separated from marginal parts of metal foils as embossed patterns.

In addition, a metal foil pattern is generally adhered onto a base material and the like to make handling easy, and is used as a metal foil pattern laminate having a base material and a metal foil pattern. The adhesive force of the adhesive film described above is set to be weak to detach a region which does not require the metal foil easily. Therefore, when a metal foil pattern is used for a long time period as the metal foil pattern is placed on an adhesive film, the position of the metal foil pattern to the adhesive film may become misaligned.

The present invention was completed in light of the problems described above, and an object of the present invention is to provide a durable and reliable circuit board that can be easily manufactured even when a metal foil is cut to form a plurality of metal electrodes, and to provide a method for manufacturing a circuit board.

Another object of the present invention is to provide a durable and reliable solar cell module.

An additional object of the present invention is to provide a metal foil pattern, in which a region which does not require metal foil can be easily removed from an adhesive film, and to provide a method for punching a metal foil.

Moreover, still another object of the present invention is to provide a metal foil pattern laminate, in which not only a region which does not require the metal foil can be easily removed to prevent misalignment of a metal foil when a half-cut process is performed, but also a metal foil pattern can be held with a strong sticking force; and to provide a method for punching a metal foil.

To solve the problems described above, the present invention has the following aspects.

(1) One aspect of the present invention is a method of manufacturing a circuit board, including steps of: forming a plurality of metal electrodes so as to be separated from each other on a holding sheet by cutting a metal foil held on the holding sheet to remove a portion of the metal foil; forming adhesive layers on surfaces of the plurality of metal electrodes; adhering the adhesive layers to a base material by closely contacting the adhesive layers with the base material; and transcribing the adhesive layers and the plurality of metal electrodes onto the base material by detaching the holding sheet from the plurality of metal electrodes.

(2) In the method of manufacturing a circuit board described in above-described (1), the portion of the metal foil may be removed by: providing an adhesive layer between the metal foil and the holding sheet; cutting the metal foil by punching with a punching blade while forming the plurality of metal electrodes; and forming a detachment portion between the metal foil and the adhesive layer on a lateral side of the punching blade when cutting the metal foil.

(3) In the method of manufacturing a circuit board described in above-described (2), the step of forming the plurality of metal electrodes may include: laminating the metal foil onto the adhesive layer; separating a metal region which requires metal foil and a region which does not require metal foil in the metal foil by pushing a tip of the punching blade onto the metal foil to cut the metal foil in a cross section that is parallel to a thickness direction of the metal foil, along a separating line defined by the tip of the pushed punching blade, and by detaching a predetermined area of the metal foil whose center is the separating line from the adhesive layer; and shredding the region which does not require the metal foil by pushing a tip of the punching blade onto the region which does not require the metal foil to cut the region which does not require the metal foil in a cross section that is parallel to the thickness direction, along a shredding line defined by the tip of the pushed punching blade, and by detaching a predetermined area of the region which does not require the metal foil whose center is the shredding line from the adhesive layer, and after laminating the metal foil and shredding the region which does not require the metal foil, a distance between the shredding line and the separating line in the cross section that is parallel to the thickness direction may be set to be equal to or less than a first length.

(4) The method of punching a metal foil described in above-described (3) may further include a step of preliminary determining a detachment length, wherein the detachment length is a length of when the metal foil is detached from the adhesive layer by setting a base line as a center, the base line being defined by a tip of a pushed punching blade when the tip of the punching blade is pushed onto the metal foil, the metal foil being laminated on the adhesive layer, in a cross section that is parallel to a thickness direction of the metal foil, and wherein a value twice of the detachment length may be used as the first length.

(5) In the method of manufacturing a circuit board described in above-described (4), a minimum value of a distance between the separating lines adjacent to each other may be larger than the detachment length at least in a portion of the region which requires the metal foil.

(6) In the method of manufacturing a circuit board described in any one of above-described (3)-(5), the tip of the punching blade may be formed to have an acute angle.

(7) In the method of manufacturing a circuit board described in any one of above-described (3)-(6), the step of separating the region which requires the metal foil and the region which does not require the metal foil in the metal foil and the step of shredding the region which does not require the metal foil may be performed at the same time.

(8) Another aspect of the present invention is a method of punching a metal foil wherein a base material and a metal foil are adhered with a stepwise-curing type adhesive, and a tip of a punching blade is pushed onto the metal foil to cut the metal foil, the method including steps of: adhering the base material and the metal foil through the stepwise-curing type adhesive; separating the region which requires the metal foil and the region which does not require the metal foil in the metal foil by pushing a tip of the punching blade onto the metal foil to cut the metal foil in a cross section that is parallel to a thickness direction of the metal foil, along a separating line defined by the tip of the pushed punching blade, and by detaching a predetermined area of the metal foil whose center is the separating line from the stepwise-curing type adhesive; shredding the region which does not require the metal foil by pushing the tip of the punching blade onto the region which does not require the metal foil to cut the region which does not require the metal foil in a cross section that is parallel to the thickness direction, along a shredding line defined by the tip of the pushed punching blade, and by detaching a predetermined area of the region which does not require the metal foil whose center is the shredding line from the stepwise-curing type adhesive; and curing the stepwise-curing type adhesive by heating to obtain a stepwise-curing type adhesive layer whose adhesive force is larger than that of the stepwise-curing type adhesive, wherein after passing through the step of separating the region which requires the metal foil and the region which does not require the metal foil in the metal foil and passing through the step of shredding the region which does not require the metal foil, a distance between the shredding line and the separating line in the cross section that is parallel to the thickness direction is set to be equal to or less than a second length.

(9) In the method of punching a metal foil described in above-described (8), the method may further include a step of pressing the stepwise-curing type adhesive that, by pressing and deforming the stepwise-curing type adhesive, a space between the stepwise-curing type adhesive and the region which requires the metal foil are filled, the space being formed in the step of separating the region which requires the metal foil and the region which does not require the metal foil in the metal foil.

(10) In the method of punching a metal foil described in above-described (8) or (9), an adhesive force in the 180° detachment test defined by JIS K6854-2 may be: 0.05 N/cm or more and 1.0 N/cm or less for the stepwise-curing type adhesive, and 3.0 N/cm or more for the stepwise-curing type adhesive layer.

(11) In the method of punching a metal foil described in any one of above-described (8)-(10), a surface of the stepwise-curing type adhesive layer that is obtained by curing the stepwise-curing type adhesive may not have tackiness.

(12) The method of punching a metal foil described in any one of above-described (8)-(11) may further include a step of preliminary determining a detachment length, wherein the detachment length may be a length of when the metal foil is detached from the stepwise-curing type adhesive by setting a base line as a center, the base line being defined by a tip of the pushed punching blade when the tip of the punching blade is pushed onto the metal foil, the metal foil being adhered to the base material through the stepwise-curing type adhesive, in a cross section that is parallel to a thickness direction of the metal foil, wherein a value twice of the detachment length may be used as the second length.

(13) In the method of punching a metal foil in above-described (12), a minimum value of a distance between the separating lines adjacent to each other may be larger than the detachment length at least in a portion of the region which requires the metal foil.

(14) In the method of punching a metal foil described in any one of above-described (8)-(13), the tip of the punching blade may be formed to have an acute angle.

(15) In the method of punching a metal foil described in any one of above-described (8)-(14), the step of separating the region which requires the metal foil and the region which does not require the metal foil in the metal foil and the step of shredding the region which does not require the metal foil may be performed at the same time.

(16) Another aspect of the present invention is a metal foil pattern laminate manufactured by the method of punching a metal foil described in any one of above-described (8)-(15).

(17) Another aspect of the present invention is a circuit board including: a base material; a plurality of adhesive layers formed on a surface of the base material, the plurality of adhesive layers being separated from each other; and a metal electrode formed on each of the adhesive layers.

(18) In the circuit board described in above-described (17), an outer surface of each of the metal electrodes may slope outward from a surface of each of the metal electrodes to the adhesive layer, and a protruding portion that protrudes to the adhesive layer may be formed on an end portion of the outer surface.

(19) Another aspect of the present invention is a solar cell module including: the circuit board described in the above-described (17) or (18); and a solar cell electrically connected onto the circuit board.

According to the circuit board and the method of manufacturing a circuit board described above, a metal electrode is formed on each of the plurality of adhesive layers that are formed so as to be separated from each other so that a continuous adhesive layer does not remain between adjacent metal electrodes, and thus even when a plurality of metal electrodes are formed by cutting a metal foil, a durable and reliable circuit board can be easily manufactured and provided.

Also, according to the solar cell module described above, because the solar cell module described above has the circuit board described above, a durable and reliable solar cell module can be provided.

According to the circuit board and method of manufacturing a circuit board described above, a region which does not require the metal foil can be easily removed from an adhesive film.

According to the metal foil pattern and the method of punching a metal foil described above, a region which does not require the metal foil can be easily removed from a stepwise-curing type adhesive.

BRIEF DESCRIPTION OF THE DRAWINGS

The following is a brief description of the drawings.

DESCRIPTION OF EMBODIMENTS

Hereinafter, a circuit board, a method of manufacturing the same, and a solar cell module according to embodiments of the present invention will be explained with reference to the drawings.

[First Embodiment]

Figure 1:
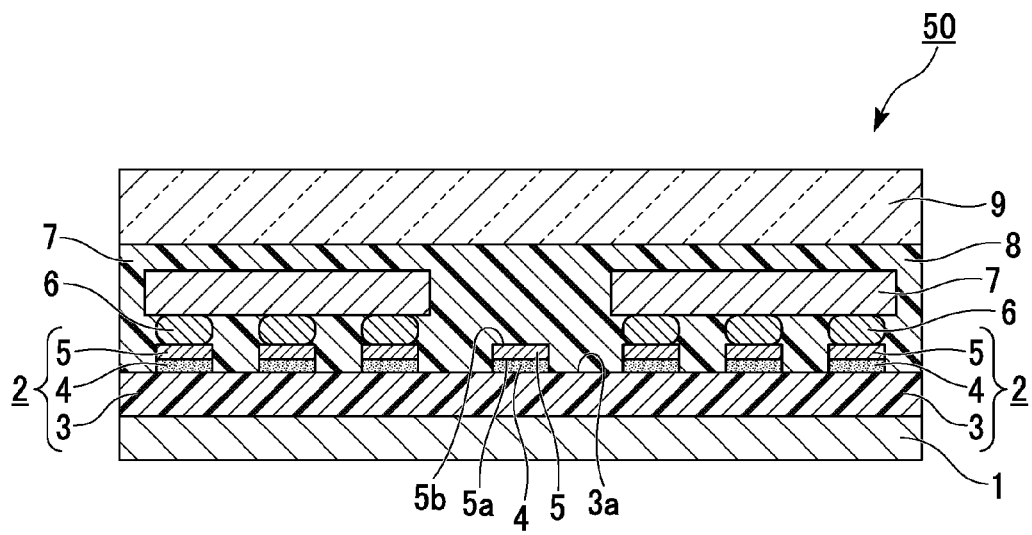
FIG. 1 is a cross-sectional view schematically showing structures of the circuit board and the solar cell module according to the first embodiment of the present invention.

FIG. 1 is a schematic cross-sectional view showing structures of a circuit board and a solar cell module according to a first embodiment of the present invention.

The circuit board 2 of the embodiment is a plate-like or sheet-like member forming a conductive pattern on its surface, and has a base material 3, an adhesive layer 4, and a metal electrode 5 as shown in the FIG. 1.

Examples of the conductive pattern include any of a land portion where electric and electronic components are soldered, a wiring pattern that conducts between lands, a circuit pattern or an electrode pattern, and the like used as such as an antenna, a sensor, and the like, or combinations of two or more of the circuit pattern, the electrode pattern, and the like.

Although an electrical product utilizing the circuit board 2 is not particularly limited, it is preferably used for applications that require high durability and high reliability. Hereinafter, a circuit board used for the solar cell module 50 will be explained as an example of such electrical products that require high durability and high reliability.

The base material 3 is a plate-like or sheet-like member having electric insulation.

In the present embodiment, a resin sheet made from polyethylene terephthalate having a thickness of 0.05 mm-0.2 mm is used as one example, and has good flexibility.

The adhesive layer 4 fixes a metal electrode 5 on the base material 3, and a plurality of the adhesive layers 4 are formed on the base material surface 3a of the base material 3 separated from each other.

A material composing the adhesive layer 4 can be suitably selected by considering the material, the temperature during use, and the adhesive strength of the metal electrode 5. For example, an epoxy adhesive, a urethane adhesive, an acrylic adhesive and the like can be used.

In the present embodiment, urethane adhesive is used as an example.

The metal electrode 5 includes a metal thin film that forms a conductive pattern. One metal electrode 5 is formed on each of the adhesive layers 4. That is, a plurality of the metal electrodes 5 are provided depending on the number of the adhesive layers 4.

Hereinafter, a surface of each of the metal electrodes 5, which closely contacts the adhesive layer 4 is referred to as the first surface 5a, and a surface opposite to the first surface 5a is referred to as the second surface 5b.

In the present embodiment, the shape of each of the metal electrodes 5 in planar view is the same as that of the adhesive layer 4. Accordingly, as shown in the FIG. 1, in a cross section that is parallel to the thickness direction, the adhesive layer 4 and the metal electrode 5 are laminated with the same thickness as each other.

As a material composing the metal electrode 5, metal materials having good electrical conductivity can be suitably selected. Examples of the metal electrode 5 include copper, aluminium, nickel, brass, gold, silver, lead and the like.

The thickness of the metal electrode 5 is not particularly limited as long as the requisite electrical conductivity can be obtained. However, when the metal electrode 5 is formed by punching out a metal foil with a metal mold having a punching blade, for example, the thickness of the metal electrode 5 is preferably 5 µm or more and 1 mm or less from the viewpoint of the punching property of the metal mold. When the thickness of the metal electrode 5 is less than 5 µm, handling of a metal foil becomes difficult; however, when it is over 1 mm, punching becomes difficult. In addition, the film thickness of a metal foil that forms the metal electrode 5 is preferably 200 µm or less from the viewpoint of the durability of the metal mold.

For example, a copper foil having 35 µm of thickness is used in the present embodiment Next, the overall structure of the solar cell module 50 of the present embodiment, which has a circuit board 2, will be explained.

The solar cell module 50 is a so-called back contact type solar cell module, in which a connecting terminal of an electrode (not shown in the figures) of the built-in solar cell 7 is provided on an opposite side of a light receiving surface. Although examples of a back contact via include a through-silicon via, a via not having a light receiving surface electrode, and the like, any type of back contact via can be used.

The solar cell module 50 has a back sheet 1, a circuit board 2, a solar cell 7, and a glass panel 9. Hereinafter, the solar cell module will be explained. As shown in the FIG. 1, in the solar cell module, the back sheet 1 and the glass panel 9 are provided on the downside and the upside respectively, and external light entering into the solar cell 7 through the glass panel 9 is converted into electric power.

The back sheet 1 is a supporting member that supports the base material 3 of the circuit board 2 on a surface opposite to a surface where the adhesive layer 4 is provided, and in the present embodiment, the back sheet forms the most outer surface of the bottom of the solar cell module 50.

The circuit board 2 is fixed on the back sheet 1 so that the metal electrode 5 faces the side opposite to the back sheet 1 (upside).

Each of a plurality of the solar cells 7 is placed upside of some of a plurality of the metal electrodes 5 in the circuit boards 2. A connecting terminal (not shown in the figures) of an electrode of the solar cell 7 faces to downside, and is electrically connected to some of a plurality of the metal electrodes 5 in the circuit board 2 through the solder joints 6.

The metal electrodes 5 in the circuit board 2 is pattern-formed to electrically connect a plurality of the solar cells 7 in the solar cell module 50 to each other, and thereby electric power obtained in each of the solar cells 7 can be output from plus and minus output terminals (not shown in the figures) provided on the solar cell module 50.

The connection pattern of each of the solar cells 7 can be a connection pattern in which series connections and parallel connections are combined as needed.

The glass panel 9 is placed on the upside of the solar cells 7, and transmits external light to the solar cells 7. The glass panel 9 forms the most outer surface of the top of the solar cell module 50.

The light-transmitting sealing member 8 is filled between the base material surface 3a of the base material 3 and the glass panel 9 to fix each of the solar cells 7 as well as to insulate conductors from each other. Accordingly, the solar cell module 50 is formed as a plate-like shape that is sandwiched between the back sheet 1 and the glass panel 9.

As a material forming the sealing member 8, for example, an ethylene-vinyl acetate copolymer resin (EVA resin) can be used.

FIG. 1 shows a part of a cross sectional view of the solar cell module 50. In the whole structure of the solar cell module 50, the solar cell 7 with a pattern shown in the FIG. 1 is repeatedly arranged in the horizontal direction in the FIG. 1, and in the vertical direction to the horizontal direction and to the thickness direction in the FIG. 1.

Although it is not particularly shown in the figures, the solar cell module 50 has a rectangular shape in planar view.

Next, a method of manufacturing the circuit board 2 having such a structure will be explained.

Figure 2:
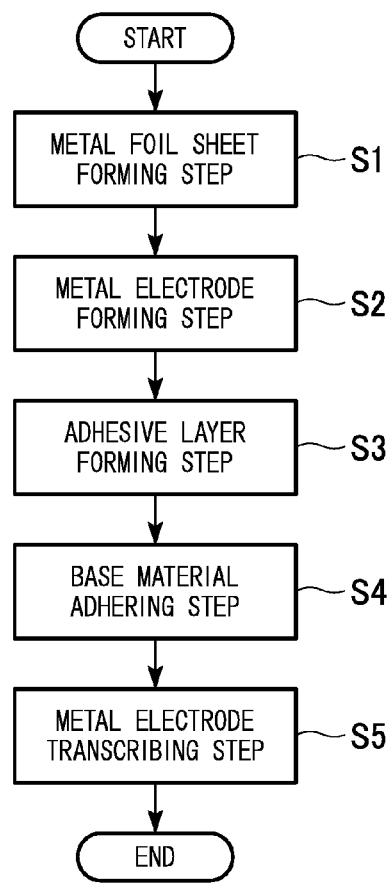
FIG. 2 is a flow chart showing a flow of a method of manufacturing a circuit board of the first embodiment.
Figure 3A:
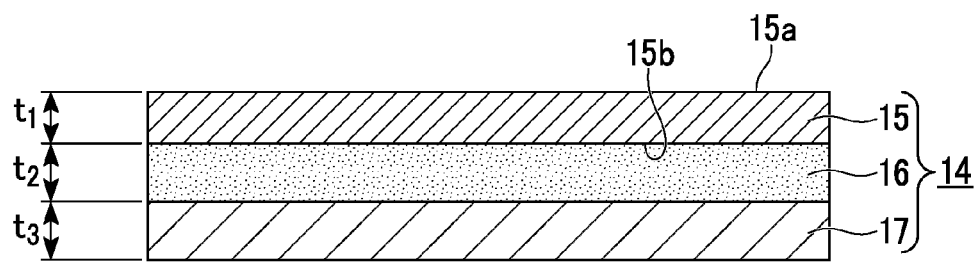
FIG. 3A is a schematic cross-sectional view illustrating the metal foil sheet forming step in the method of manufacturing the circuit board according to the first embodiment.
Figure 3B:
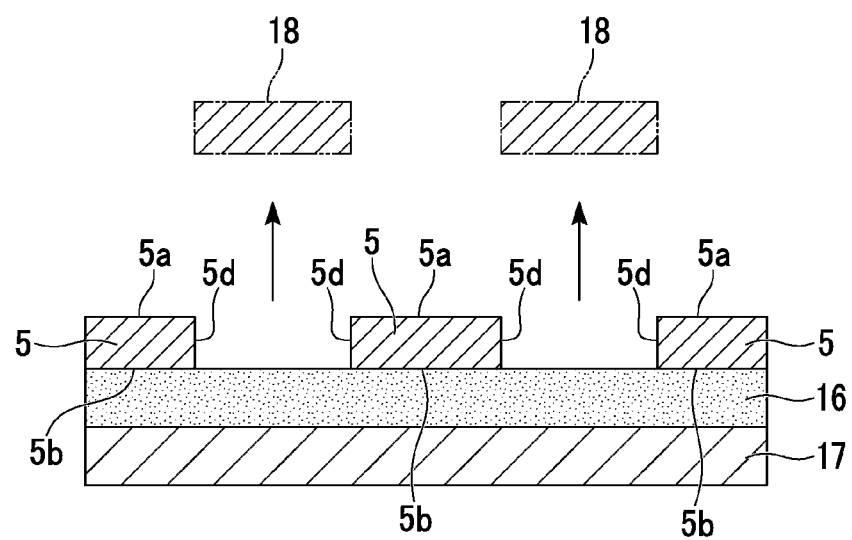
FIG. 3B is a schematic cross-sectional view illustrating the metal electrode forming step in the method of manufacturing a circuit board according to the first embodiment.
Figure 4A:
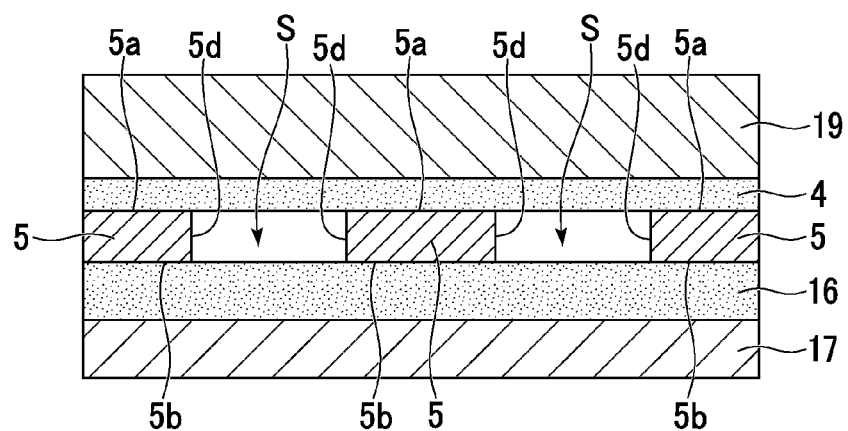
FIG. 4A is a schematic cross-sectional view illustrating the adhesive layer forming step in the method of manufacturing a circuit board according to the first embodiment.
Figure 4B:
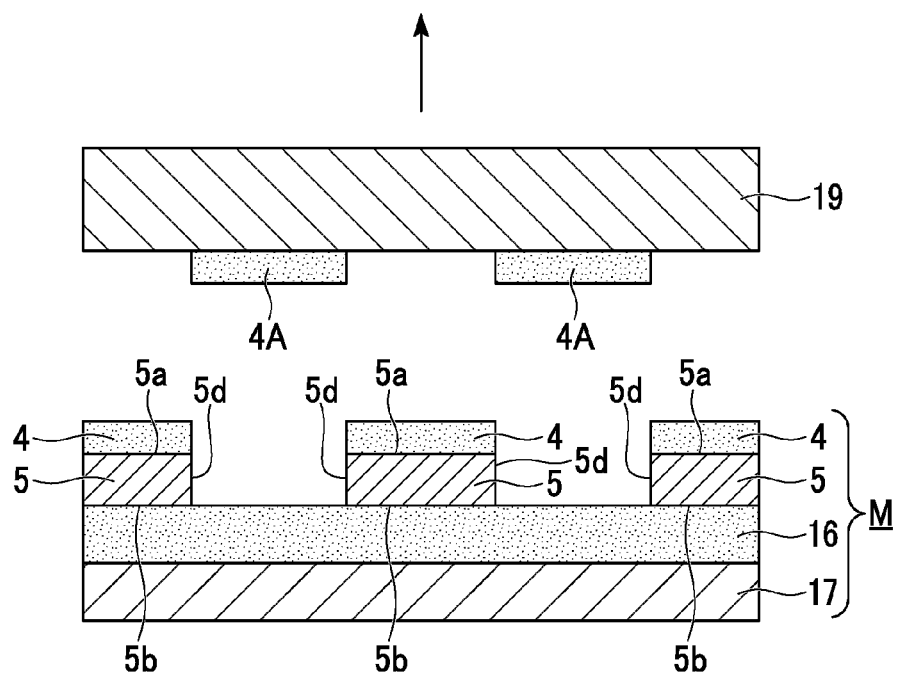
FIG. 4B is a schematic cross-sectional view illustrating the adhesive layer forming step in the method of manufacturing the circuit board according to the first embodiment.
Figure 5A:
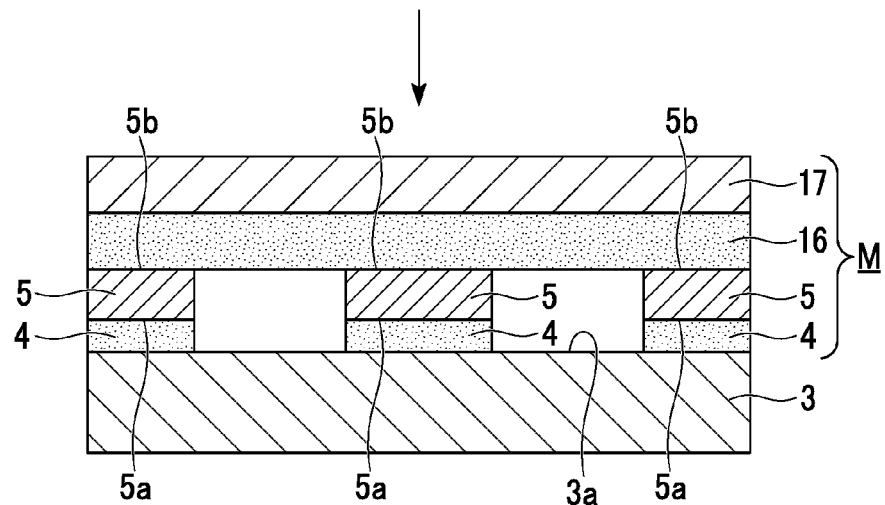
FIG. 5A is a schematic cross-sectional view illustrating the base material adhering step in the method of manufacturing the circuit board according to the first embodiment.
Figure 5B:
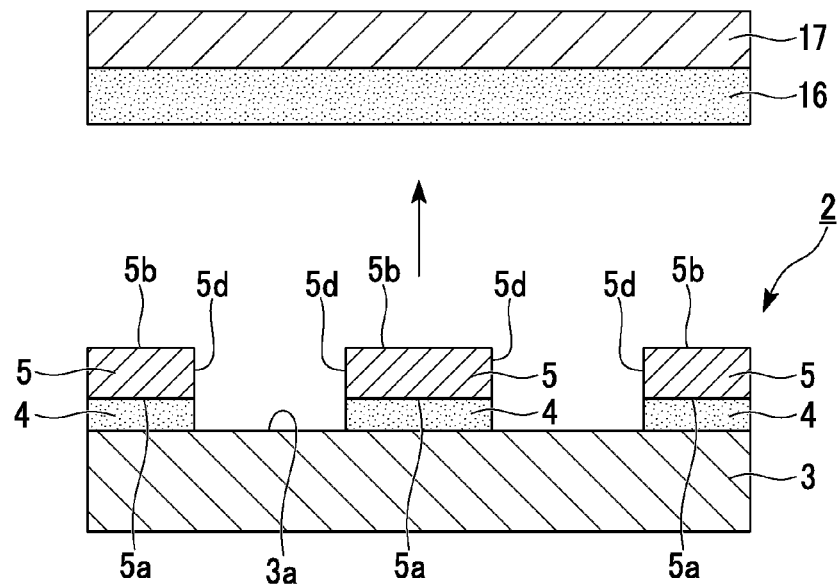
FIG. 5B is a schematic cross-sectional view illustrating the metal electrode transcribing step in the method of manufacturing the circuit board according to the first embodiment.

FIG. 2 is a flow chart showing a flow in a method of manufacturing a circuit board of the first embodiment. FIGS. 3A and 3B are schematic cross-sectional views illustrating a metal foil sheet forming step and a metal electrode forming step in a method of manufacturing a circuit board of the first embodiment. FIGS. 4A and 4B are schematic cross-sectional views illustrating an adhesive layer forming step in a method of manufacturing a circuit board of the first embodiment. FIGS. 5A and 5B are schematic cross-sectional views illustrating a base material adhering step and a metal electrode transcribing step in a method of manufacturing a circuit board of the first embodiment.

In a method of manufacturing the circuit board 2 of the first embodiment, the metal foil sheet forming step S1, the metal electrode forming step S2, the adhesive layer forming step S3, the base material adhering step S4, and the metal electrode transcribing step S5 are performed in this order shown in the FIG. 2.

Firstly, the metal foil sheet forming step S1 is performed. In this step, a metal foil sheet, which holds a metal foil on a holding sheet, is formed.

In the present embodiment, as shown in the FIG. 3A, a sheet member in which the holding sheet 17, the adhesive layer 16, and the metal foil layer 15 (metal foil) are laminated in this order is formed as the metal foil sheet 14.

The metal foil sheet 14 can be suitably placed so that each of the steps that will be described below can be performed without any problems. To simplify the explanation, the structure shown in the FIG. 3A, in which the holding sheet 17 is located on the downside and the metal foil layer 15 is located on the upside, will be explained below as an example.

To form the metal electrodes 5 by cutting, the metal foil layer 15 includes a metal foil whose thickness and a material are the same as those of the metal electrode 5, and has a size covering an area on the base material 3 of the circuit board 2 where the metal electrodes 5 are formed.

In the present embodiment, a copper foil having a thickness $t1=35$ (µm), which is cut into the width of the base material 3, can be used.

The adhesive layer 16 is formed on the holding sheet 17 with a constant thickness, and fixes the metal foil layer 15 to the holding sheet 17 by closely contacting a surface of a first side of the metal foil layer 15. Hereinafter, one surface of the metal foil layer 15, which closely contacts the adhesive layer 16, is referred to as the second surface 15b, and another surface is referred to as the first surface 15a.

A material that closely contacts the metal foil layer 15 with a force that is weaker than the adhesive force between the adhesive layer 4 and the metal electrode 5, which will be described below, is selected as a material composing the adhesive layer 16.

Note that the sticking force between the adhesive layer 16 and the metal foil layer 15 can be adjusted by treating a surface of the metal foil layer 15.

The holding sheet 17 is a sheet member that holds a plurality of the metal electrodes 5 until they are transcribed onto the base material 3. A plurality of the metal electrodes 5 are formed by cutting the metal foil layer 15, and the holding sheet 17 holds the metal electrodes 5 while holding the relative positions thereof when they are cut.

A suitable resin sheet can be used as the holding sheet 17.

The sum of the thicknesses of the adhesive layer 16 and the holding sheet 17 is determined so that the half-cut process can be performed. The half-cut process is that a punching blade cuts the metal foil layer 15 without cutting the holding sheet 17 when punching the metal foil layer 15. In this case, the sum of thicknesses of the adhesive layer 16 and the holding sheet 17 is preferably 50 µm or more. When the sum of the thicknesses is thinner than 50 µm, it is difficult to stop a blade edge of a punching blade at a middle portion in a thickness direction of the holding sheet 17.

As one example, an acrylic urethane sticky material having a thickness $t2=7$ (µm) can be used for the adhesive layer 16. For example, a sheet member of polyethylene terephthalate resin having a thickness $t3=50$ (µm) can be used for the holding sheet 17.

The metal foil sheet 14 can be manufactured using suitable, known steps.

For example, in the present embodiment, the metal foil sheet 14 can be manufactured by bonding the metal foil layer 15 and a rolled adhesive sheet in which the adhesive layer 16 is coated onto the holding sheet 17. As such a manufacturing step, for example, a roll-to-roll lamination process can be used.

Then, the metal foil sheet forming step S1 is completed.

When a trilaminar sheet member product suitable as the metal foil sheet 14 is available, the step described above can be replaced by a step of forming a metal foil sheet 14 by trimming the product into the size needed.

Also, when the size of the sheet member product is in accord with the desired size of the metal foil sheet 14, trimming is not needed. Thus, the metal foil sheet forming step S1 can be omitted, and the sheet member product itself can be used as the metal foil sheet 14.

Next, the metal electrode forming step S2 is performed. In this step, the metal foil layer 15 of the metal foil sheet 14 is cut to remove a portion of the metal foil, and thereby a plurality of the metal electrodes 5 are formed on the holding sheet 17 separated from each other.

In this step, for example, as shown in the FIG. 3B, the metal foil layer 15 is cut in a thickness direction following a position where the outer surface 5d of the metal electrode 5 in the circuit board 2 is formed. Then, the removal portion metal foils 18 that correspond to the portions between the adjacent metal electrodes 5 are removed from the adhesive layer 16 by detaching them. Accordingly, the outer surfaces 5d are formed on the lateral side of the metal electrode 5 on the adhesive layer 16 by cutting, and a plurality of the metal electrodes 5 that closely contact the adhesive layer 16 remain.

In the present embodiment, the sticking force between the adhesive layer 16 and the metal foil layer 15 is weak, and therefore the adhesive layer 16 is hardly deformed by a force which arises when the removal portion metal foil 18 is detached. That is, the height of the top surface of the adhesive layer 16 is hardly changed. Accordingly, a difference in level is formed between each of the first surfaces 5a after the detachment and a top surface of the adhesive layer 16 exposed by removing the removal-portion metal foils 18. The difference in level is approximately the same as a thickness of the metal electrode 5. As a result, a space is formed between each of the outer surfaces 5d of the adjacent metal electrodes 5 in a horizontal direction of the figure.

The top surface of the adhesive layer 16 does not protrude over the first surface 5a. Note that irregularity is acceptable as long as it does not become a problem in the adhesive layer forming step S3 that will be described below.

A cutting process of the metal foil layer 15 used in this step is not particularly limited as long as if the metal foil layer 15 can be certainly cut in the thickness direction by the cutting process. Examples of the cutting process include a cutting process with a press that uses a punching template having a punching blade, a cutting process transferring a cutting tool on the metal foil layer 15, a cutting process using laser beam irradiation, and the like. Among these cutting processes, examples in which a cutting process using a press will be explained collectively in detail below.

Note that in the schematic drawing of the FIG. 3B, the outer surfaces 5d is drawn to be orthogonal to the first surface 15a; however, they can be suitably sloped depending on the cutting process. Also in the FIG. 3B, the adhesive layer 16 does not seem to be deformed at all; however, deformations and damages of the adhesive layer 16 are acceptable as long as the holding sheet 17 is not broken, and the metal electrodes 5 are joined to the adhesive layer 16.

In this step, the metal foil layer 15 is certainly cut along a shape of the metal electrode 5, and the sticking force of the adhesive layer 16 to the metal electrode 5 is weaker than the adhesive force of the adhesive layer 4 to the metal electrode 5, which will be described below. Accordingly, a suitable detachment process can be used to detach the removal portion metal foil 18.

For example, mechanical detachment using a detachment jig and the like, and detachment by aspiration using an aspiration machine can be used.

Next, the adhesive layer forming step S3 is performed. In this step, the adhesive layer 4 is formed on the first surfaces 5a, which are surfaces of a plurality of the metal electrodes 5.

First, a surface of the plate-like or rolled adhesive layer holder 19 (see FIG. 4A) is coated with an adhesive that forms the adhesive layer 4.

A surface of the adhesive layer holder 19 is processed depending on the adhesive that forms the adhesive layer 4, so that the sticking force between the adhesive layer holder 19 and the adhesive layer 4 is smaller than the sticking force between the metal electrodes 5 and the adhesive layer 16.

Next, as shown in the FIG. 4A, the adhesive layer 4 are closely contacted with the first surfaces 5a, by placing the adhesive layer holder 19 onto the first surfaces 5a.

At that time, spaces exist between each of the metal electrodes 5 in a horizontal direction, and thus the spaces S surrounded by a top surface of the adhesive layer 16, the outer surfaces 5d facing each other, and a surface of the adhesive layer 4 are formed between adjacent metal electrodes 5.

Next, as shown in the FIG. 4B, the adhesive layer holder 19 is relatively moved to a direction separated from the metal electrodes 5. The adhesive layers 4 are detached from the adhesive layer holder 19, since the adhesive layers 4 contact the first surfaces 5a with a force stronger than the adhesive layer holder 19. On the other hand, the adhesive layers 4 between the adjacent metal electrodes 5 closely contact only the adhesive layer holder 19 because of the spaces S. Accordingly, the adhesive layers 4 between the adjacent metal electrodes 5 are moved as the non-transcribing adhesive layers 4A, as they are kept closely contacted with the adhesive layer holder 19, and thereby separated from the adhesive layers 4 that are closely contacted onto the first surfaces 5a.

As a result, the adhesive layer 4, which has a shape similar to that of the first surface 5a, remains on the first surface 5a of each of the metal electrodes 5. Accordingly, in the present embodiment, a plurality of adhesive layers 4, each of which has a shape identical to the cutting shape of each of the metal electrodes 5, are formed, and the number of the adhesive layers 4 and number of the metal electrodes 5 are the same.

Hereinafter, a laminate, which has a holding sheet 17, an adhesive layer 16, a plurality of metal electrodes 5, and a plurality of adhesive layers 4, formed as explained above is referred to as the intermediate laminate M.

Then, the adhesive layer forming step S3 is completed.

Next, the base material adhering step S4 is performed. In this step, the adhesive layers 4 are closely contacted with the base material 3 so that each of the metal electrodes 5 are adhered to the base material 3.

For example as shown in FIG. 5A, the intermediate laminate M and the base material 3 face each other with the adhesive layers 4 therebetween, and the intermediate laminate M is relatively moved to the base material 3 so that the adhesive layers 4 are closely contacted with the base material 3. Then, the intermediate laminate M and the base material 3 are held until an enough adhesive force is obtained between the adhesive layers 4 and the base material 3.

Accordingly, each of the adhesive layers 4 in the intermediate laminate M is adhered to the base material 3.

At that time, spaces are formed between each of the adjacent metal electrodes 5 in the intermediate laminate M, and therefore the adhesive layer 16 between each of the metal electrodes 5 is separated from the base material 3.

Then, the base material adhering step S4 is completed.

Next, the metal electrode transcribing step S5 is performed. In this step, the holding sheet 17 is detached from each of the metal electrodes 5, and thereby each of the adhesive layers 4 and each of the metal electrodes 5 are transcribed onto the base material 3.

As shown in the FIG. 5B, when the holding sheet 17 is relatively moved to a direction separating it from the base material 3, the adhesive layer 16 is separated from the second surfaces 5b, because the sticking force between the second surfaces 5b and the adhesive layer 16 is weaker than an adhesive force between the first surfaces 5a and the adhesive layers 4, and thus the holding sheet 17 as well as the adhesive layer 16 are detached.

Accordingly, among the intermediate laminate M, a laminate portion that is formed by the metal electrodes 5 and the adhesive layers 4 are transcribed onto the base material 3.

Then, the metal electrode transcribing step S5 is completed.

Accordingly, the circuit board 2 is manufactured.

Here, an example of the metal electrode forming step S2 when using a cutting process with a press will be detailed.

Figure 6A:
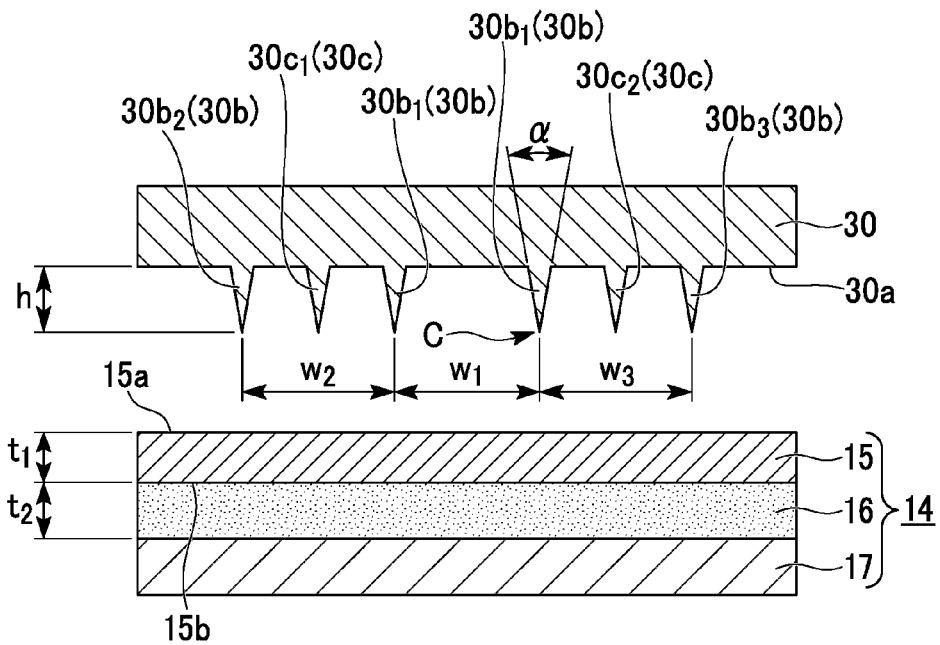
FIG. 6A is a schematic cross-sectional view illustrating one example of the metal electrode forming step in the method of manufacturing the circuit board according to the first embodiment.
Figure 6B:
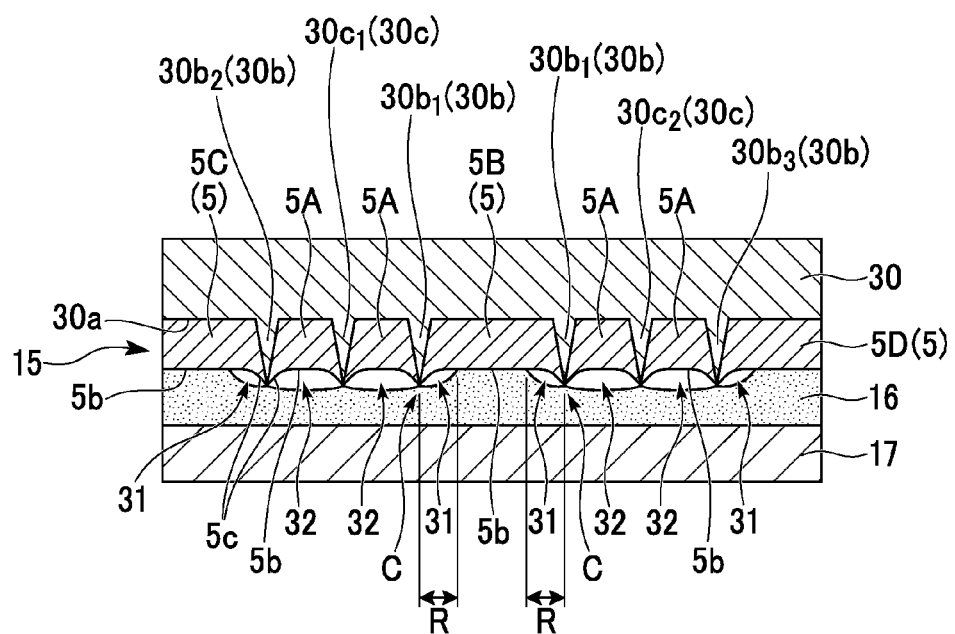
FIG. 6B is a schematic cross-sectional view illustrating one example of the metal electrode forming step in the method of manufacturing the circuit board according to the first embodiment.
Figure 7A:
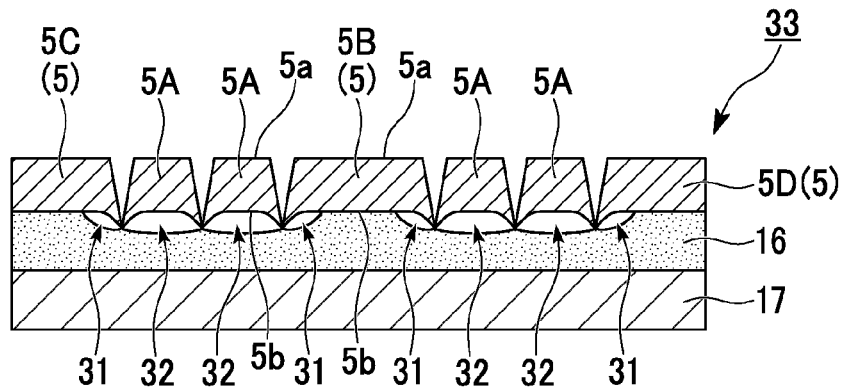
FIG. 7A is a schematic cross-sectional view illustrating one example of the metal electrode forming step subsequent to the steps in the FIGS. 6A and 6B.
Figure 7B:
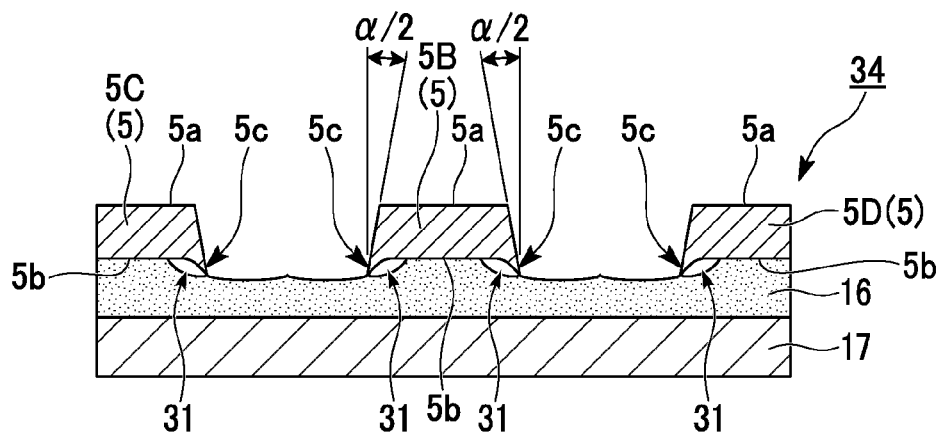
FIG. 7B is a schematic cross-sectional view illustrating one example of the metal electrode forming step subsequent to the steps in the FIGS. 6A and 6B.
Figure 7C:
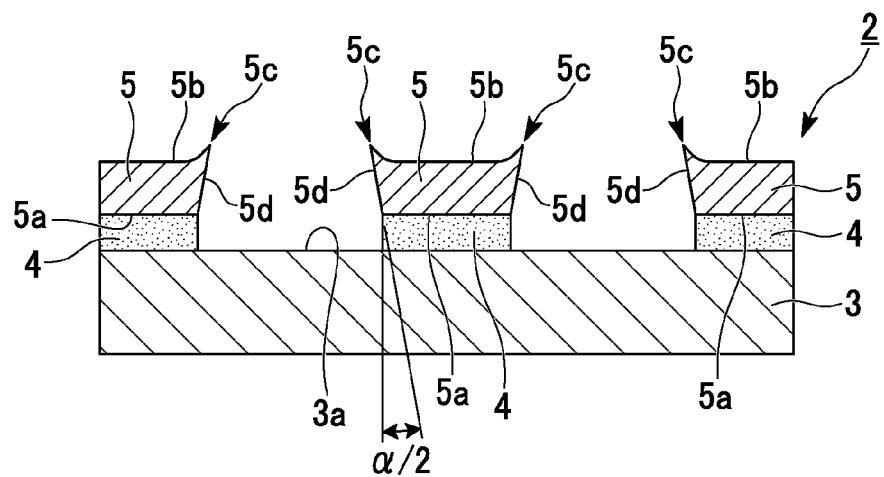
FIG. 7C is a schematic cross-sectional view showing a structure of the circuit board manufactured after passing through the steps in the FIGS. 7A and 7B.
Figure 8:
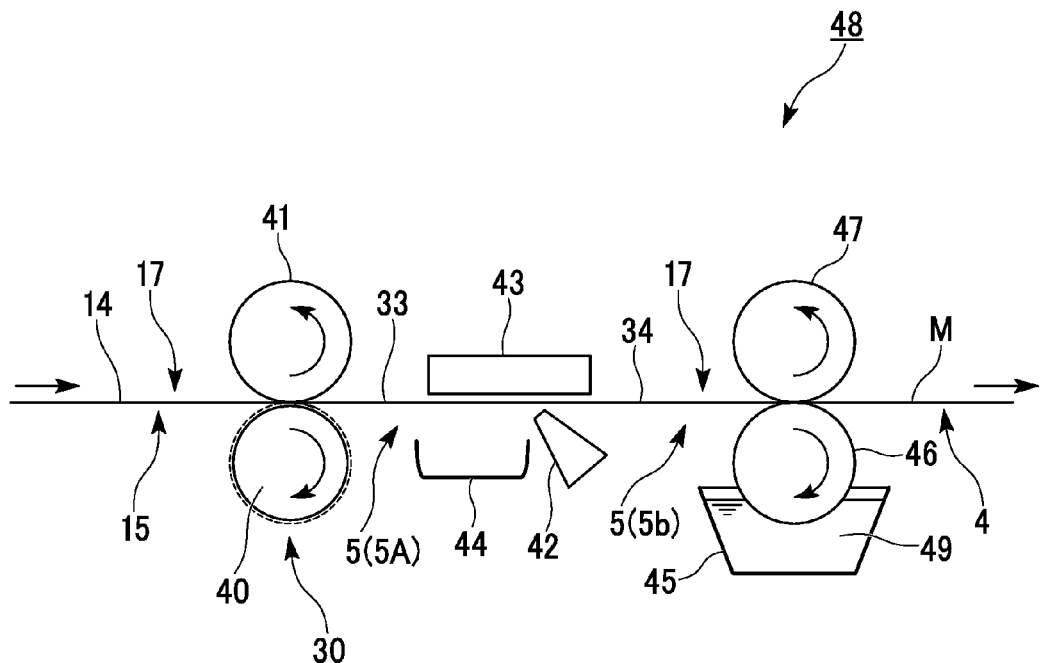
FIG. 8 is a schematic cross-sectional view showing an example of a structure of the apparatus to perform one example of the metal electrode forming step in the method for manufacturing the circuit board according to the first embodiment.

The FIGS. 6A and 6B are schematic cross-sectional views illustrating one example of a metal electrode forming step of a method for manufacturing a circuit board in an embodiment of the present invention. The FIGS. 7A and 7B are schematic cross-sectional views illustrating one example of a metal electrode forming step following the FIG. 6B. FIG. 7C is a schematic cross-sectional view showing the structure of a circuit board manufactured with the metal electrode forming step. FIG. 8 is a schematic cross-sectional view showing an example of a structure of an apparatus used in a metal electrode forming step of a method of manufacturing a circuit board in the present embodiment.

Firstly, a structure of the punching template 30 used in the present embodiment will be explained.

As shown in the FIG. 6A, a plurality of the punching blades 30b and 30c are provided on the template surface 30a as protruding.

Each of the punching blades 30b is provided to correspond to an outer shape of each of the metal electrodes 5. For example, in the FIG. 6A, punching blades 30b2, 30b1, 30b1, and 30b3 are provided as the punching blades 30b from the left to the right side of the figure. The punching blades 30b1 and 30b1 punch the metal foil layer 15 along an outer shape of one metal electrode 5B (see FIG. 6B) having a width of w1. Punching blades 30b2 and 30b3 punch the metal foil layer 15 respectively along outer shapes of metal electrodes 5C and 5D (see FIG. 6B), each of which is adjacent to the metal electrode 5B.

The punching blade 30c is provided to divide and remove the metal foil layer 15 between the metal electrodes 5. For example, in the punching template 30 shown in FIG. 6A, the punching blade 30c1 that punches the metal foil layer 15 having a width of w2 between metal electrodes 5C and 5B to bisect into two removal portion metal foils 5A, and the punching blade 30c2 that punches the metal foil layer 15 having a width of w3 between metal electrodes 5B and 5D to bisect into two removal portion metal foils 5A are provided.

The installation interval of the punching blades 30c can be suitably set depending on the size of the space between the metal electrodes 5.

The punching blades 30b and 30c extend in parallel with the template surface 30a, and are formed as isosceles triangular shapes that taper in protruding directions in a cross section orthogonal to a longitudinal direction, and the blade edges C are formed on the tips in the protruding directions. The angle α of the blade edge C is preferably formed to have an acute angle. Although as the angle α decreases, a burr is formed on the metal foil layer 15 at the time of cutting also becomes smaller, the durability of the punching template 30 will be decreased. Generally, the angle α is preferably approximately 40°-60°.

The heights h of the punching blades 30b and 30c from the template surface 30a to the tips of the blade edges C are larger than the thickness t1 of the metal foil layer 15, and the heights h do not punch through the adhesive layer 16 having the thickness t2 even when the first surface 5a is closely contacted with the template surface 30a. That is, t1<h<t1+t2.

In addition, the heights h are set to dimensions by which detachment portions are formed between the metal foil layer 15 and the adhesive layer 16 at lateral sides of each of the blade edges C, when the metal foil layer 15 is punched by the punching blades 30b and 30c. The detachment portions are small spaces between the metal foil layer 15 and the adhesive layer 16, and are formed at lateral sides of each of the blade edges C by punching.

An area where detachment portions are formed is unambiguously determined when the followings is decided: specifications such as the firmness of the holding sheet 17, the sticking force of the adhesive layer 16, and the like; specifications such as the material, thickness and the like of the metal foil layer 15; specifications such as the material, the shape and the like of the punching blades 30b and 30c; and the depth to which the tip of the blade edge C reaches at the time of punching. Therefore, the height h, which is to form a detachment portion with a suitable size, is determined preliminarily by performing an experiment or the like.

In the present embodiment, the height h is preliminarily determined by experiments using materials that are practically used. By using the determined height h, the adhesive layer 16 is completely detached from the second surface 5b of the removal portion metal foil 5A, between the adjacent punching blades 30b and 30c, and between the adjacent punching blades 30c and 30c; and partial close contact between the metal electrode 5 and the adhesive layer 16 is held between the punching blades 30b and 30b that form each of the plurality of metal electrodes 5.

A corrosion metal mold, a cutting metal mold and the like can be used for the punching template 30, but is not limited thereto. Prehardened steel, quenched and tempered steel, precipitation hardening steel, a tungsten carbide and cobalt alloy, other high hardness alloys and the like can be used to form the punching template 30, but is not limited thereto.

To perform the metal electrode forming step S2 by using the punching template 30 described above, a position of the punching template 30 is adjusted on the metal foil layer 15 in the metal foil sheet 14 as shown in the FIG. 6A.

Then, the punching template 30 is pressed onto the metal foil sheet 14.

Accordingly, as shown in the FIG. 6B, each of the punching blades 30b and 30c pass through the metal foil layer 15, and the template surface 30a closely contacts the first surface 15a. At that time, the tip of each of the blade edges C reaches into the adhesive layer 16 as cutting the metal foil layer 15.

The metal foil layer 15 is plastically deformed along lateral shapes of the punching blades 30b and 30c, and then the V-shapes following the shapes of punching blades 30b and 30c are formed.

Since stress concentrates on the tips of the blade edges C, the metal foil layer 15 is cut along longitudinal directions of the punching blades 30b and 30c (a direction vertical to the plane of the paper of the FIG. 6A). Accordingly, the metal foil layer 15 is cut into the metal electrodes 5 and the removal portion metal foils 5A.

The protruding portions 5c protruding toward the adhesive layer 16 are formed on sides of the second surface 5b of both of the metal electrode 5 and the removal portion metal foil 5A by plastic deformation.

Accordingly, the second surface 5b around the protruding portion 5c is curved. Also, the adhesive layer 16 is pushed down toward the holding sheet 17 by the tip of the blade edge C, and then curved. Therefore, the second surface 5b and the top surface of the adhesive layer 16 are separated, and small spaces are formed therebetween as the detachment portions 31 and 32.

The detachment portion 31 is formed from the lateral side of the punching blade 30b toward the metal electrode 5 with which the punching template 30 contacts, and is formed in an area of R in width laterally from the center of the punching blade 30b. Although it is not particularly shown in the figures, for example, in a direction vertical to the plane of the paper of the FIG. 6B, the detachment portions 31 are formed to have similar shapes everywhere along the blade edge C.

Since the width R is narrower than half of the minimum width of each of the metal electrodes 5, a portion that closely contacts the adhesive layer 16 remains on the second surface 5b of each of the metal electrodes 5.

Also, the detachment portion 32 is formed between the adjacent punching blades 30b and 30c, or between the adjacent punching blades 30c, and is formed on the side of the second surface 5b of the removal portion metal foil 5A. In the present embodiment, the distance between the adjacent punching blades 30b and 30c, and the width between the adjacent punching blades 30c are set as at most approximately twice the width R. Therefore, the detachment portion 32 is formed over the entire second surface 5b of the removal portion metal foil 5A. Accordingly, on the second surface 5b of the removal portion metal foil 5A, a portion where the removal portion metal foil 5A closely contacts the adhesive layer 16 will be absent.

Next, the punching template 30 is withdrawn to a direction opposite to the pressing direction, i.e., to a direction separating from the holding sheet 17. Accordingly, as shown in the FIG. 7A, the punched sheet 33 having a trilaminar structure including the metal electrodes 5 and the removal portion metal foils 5A is formed by cutting the metal foil layer 15. In the half-cut process with the punching template 30, the holding sheet 17 is not cut, and thus a size of the punched sheet 33 in a planar view is identical to that of the holding sheet 17.

Next, as shown in the FIG. 7B, the removal portion metal foils 5A are removed from the punched sheet 33 to form the unnecessary metal foil removed sheet 34.

In the punched sheet 33, each of the removal portion metal foils 5A are detached from the adhesive layer 16, and can be more easily detached by any of the above-described detachment processes.

Since the unnecessary metal foil removed sheet 34 is formed by the above-described press work, the outer surface 5d is a tapered surface having an angle α/2, which is sloped to spread outward from the first surface 5a to the second surface 5b depending on the slope at a lateral side of the punching blade 30b.

Then, the metal electrode forming step S2, in which a cutting process with a press is utilized, is completed.

Next, by using the unnecessary metal foil removed sheet 34, the adhesive layer forming step S3, the base material adhering step S4, and the metal electrode transcribing step S5 are performed similarly to the above-described steps.

Accordingly, the circuit board 2 having a cross sectional shape shown in the FIG. 7C is manufactured. That is, the adhesive layer 4 is formed on each of the first surfaces 5a in the adhesive layer forming step S3, and thereby the intermediate laminate M (not shown in the figures) having a laminate structure similar to that in the FIG. 4B is formed. Next, the intermediate laminate M is adhered to the base material 3 in the base material adhering step S4. Accordingly, the above-described unnecessary metal foil removed sheet 34 is adhered to the base material 3 through the adhesive layer 4.

Next, the holding sheet 17 is detached from the intermediate laminate M in the metal electrode transcribing step S5. Accordingly, the holding sheet 17 as well as the adhesive layer 16 are detached from each of the second surfaces 5b, and then the circuit board 2 having a cross sectional shape as shown in the FIG. 7C is formed.

In the circuit board 2 shown in the FIG. 7C, since the metal electrode forming step S2 is performed by using a cutting process with a press, each of the outer surfaces 5*d* are sloped outward at the angle α/2 as it goes from the first surface 5*a* to the second surface 5*b*. Also, the protruding portion 5*c*, which protrudes from the second surface 5*b* toward a direction opposite to the base material 3, is formed on an outer edge portion of each of the second surfaces 5*b*.

The metal electrode forming step S2 using a cutting process with a press and the adhesive layer forming step S3 can be sequentially performed using the processing apparatus 48 shown in the FIG. 8.

The processing apparatus 48 conveys the metal foil sheet 14 from the left side to the right side in the figure, and sequentially forms the punched sheet 33, the unnecessary metal foil removed sheet 34, and the intermediate laminate M by the workings of the punching roller 40, the compressed air spraying part 42, and the coating roller 46, which are sequentially placed in the processing apparatus 48 from the upstream to the downstream of the conveying direction.

The punching template 30 is provided on an outer surface of the punching roller 40, and is supported to be rotatable facing the depressing roller 41. Therefore, when the metal foil sheet 14 is inserted between the punching roller 40 and the depressing roller 41 while the punching roller 40 is rotated with the proviso that the metal foil layer 15 faces the punching roller 40, and the holding sheet 17 faces the depressing roller 41, punching by the punching template 30 is sequentially performed. Accordingly, the punched sheet 33 is manufactured from the metal foil sheet 14.

In this example, the metal foil sheet 14 is conveyed so that the holding sheet 17 is on the upside, and so that the metal foil layer 15 is on the downside. Therefore, the punching roller 40 is placed on the downside, and the depressing roller 41 is placed on the upside with the metal foil sheet 14 interposed therebetween.

In the compressed air spraying part 42, compressed air is sprayed to the removal portion metal foil 5A on the punched sheet 33, which is conveyed through the punching roller 40, to detach the removal portion metal foil 5A from the adhesive layer 16. The compressed air spraying part 42 is placed on the downstream of the punching roller 40, near a surface of the punched sheet 33, on which the metal electrodes 5 and the removal portion metal foils 5A are formed.

The removal portion metal foil collection container 44 for collection of the removal portion metal foils 5A detached from the punched sheet 33 is placed below the punched sheet 33, between the punching roller 40 and the compressed air spraying part 42 which is near the compressed air spraying part 42.

Also, the rear surface holding stage 43, which supports the punched sheet 33 from the side of the holding sheet 17 when the compressed air spraying part 42 is spraying, is provided on a position that faces the compressed air spraying part 42 with the punched sheet 33 interposed between the rear surface holding stage 43 and the compressed air spraying part 42.

The removal portion metal foils 5A are detached and removed by the compressed air spraying part 42. The removal portion metal foils 5A fall into the removal portion metal foil collection container 44 to be collected. Accordingly, the punched sheet 33 becomes the unnecessary metal foil removed sheet 34, and is conveyed toward the coating roller 46.

The coating roller 46 provides the adhesive 49, which forms the adhesive layer 4 on the second surface 5*b* of the conveying unnecessary metal foil removed sheet 34. The bottom of the coating roller 46 is dipped into the adhesive pooling part 45 in which the adhesive 49 is pooled.

On the upside of the coating roller 46, the conveying roller 47, which conveys the holding sheet 17 of the unnecessary metal foil removed sheet 34 while the holding sheet 17 is rotated, is disposed facing the coating roller 46.

Therefore, when the unnecessary metal foil removed sheet 34 is inserted between the coating roller 46 and the conveying roller 47, the adhesive 49 is coated on the second surface 5*b* of each of the metal electrodes 5, and thereby the intermediate laminate M having the adhesive layer 4 is formed.

By using the processing apparatus 48, cutting of a metal foil; detachment, removal, and collection of the removal portion metal foils 5A; and formation of the adhesive layers 4 by coating with the adhesive 49 can be sequentially performed while conveying the metal foil sheet 14. Thus, the metal electrode forming step S2 and the adhesive layer forming step S3 in the method of manufacturing a circuit board of the present embodiment can be efficiently and rapidly performed.

As explained above, in the circuit board 2 of the present embodiment, the metal electrode 5 is formed on each of a plurality of adhesive layers 4 that are formed separated from each other so that the continuous adhesive layer 4 does not remain between adjacent metal electrodes 5. Thus, a plurality of metal electrodes can be easily manufactured by cutting a metal foil.

Also, the base material 3 of the above-described circuit board 2 will not be scratched even when a punching process is utilized, and thus the circuit board 2 has good mechanical durability.

Also in the above-described circuit board 2, since each of the adhesive layers 4, which joins the adjacent metal electrode 5 and the base material 3, is separated, there is no concern for weak electric current that may pass between adjacent metal electrodes 5 through the adhesive layer 4. Also, there is no concern for progression of deterioration, so-called migration of the adhesive layer 4 which causes short circuit. As a result, the circuit board 2 is electrically durable and reliable even if used for a long time period.

As mentioned above, the circuit board 2 of the present embodiment does not have a continuous adhesive layer 4 that causes migration between adjacent metal electrodes 5. Thus, for example, the circuit board 2 is particularly suitable for electrical products required to be highly durable and reliable, such as a solar cell module that has been used in an outdoor environment in which the solar cell module is continuously irradiated with sunlight for a long time period, e.g., 10-50 years.

Also in the circuit board 2 and the method of manufacturing the same of the present embodiment, the adhesive layer 4 is not formed on the base material 3 that is between the separated adhesive layers 4. Therefore, the production cost can be reduced since adhesive usage to form the adhesive layer 4 can be reduced compared to when the adhesive layer 4 is formed on a whole surface of the base material 3.

The production cost can also be reduced more since a removing process of the adhesive layer 4 can be omitted in addition to reducing an adhesive usage compared to performing the removing process after the adhesive layer 4 is formed on the whole surface of base material 3.

Also, the solar cell module 50 of the present embodiment is durable and reliable since the above-mentioned circuit board 2 is used for it.

[Modification Example]

Next, the circuit board according to a modification example of the present embodiment will be explained.

Figure 9:
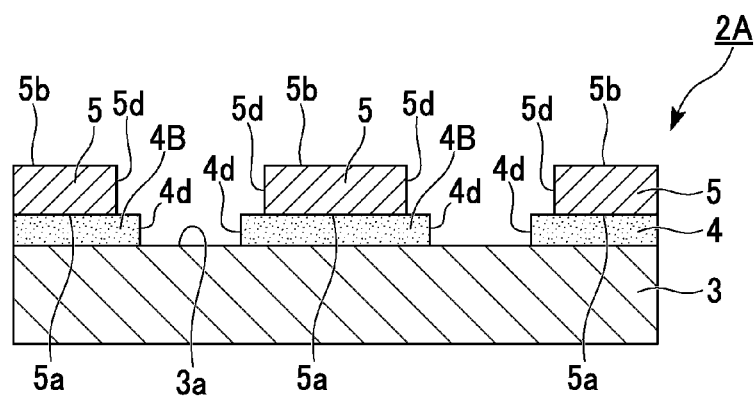
FIG. 9 is a cross-sectional view schematically showing a structure of a modified example of the circuit board according to the first embodiment.

FIG. 9 is a cross-sectional view schematically showing a structure of a modified example of the circuit board of the above-described embodiment.

As shown in the FIG. 9, the circuit board 2A of this modification example has the adhesive layers 4B instead of the adhesive layers 4 of the circuit board 2 of the above-described embodiment. Hereinafter, differences compared to the above-described embodiment will be explained.

A difference of the adhesive layer 4B compared to the adhesive layer 4 is that the outer surface 4d of the adhesive layer is located outward from the outer surface 5d of each of the metal electrodes 5.

Therefore, the adhesive layer 4B protrudes from the lateral side of each of the metal electrodes 5 when the circuit board 2A is viewed from the side of the second surface 5b. However, each of the adhesive layers' outer surfaces 4d of the adjacent adhesive layers 4B are separated from each other.

Note that in the example shown in the FIG. 9, although all of the metal electrodes 5 are laminated on the adhesive layers 4B, the circuit board 2A may have the adhesive layer 4 on which the metal electrode 5 is laminated.

Next, one example of a method of manufacturing the circuit board 2A of this modification example will be explained.

First, following the above-described embodiment, a metal electrode laminate shown in FIG. 3B, in which a plurality of metal electrodes 5 are placed on the adhesive layer 16 separated from each other, is formed (metal electrode laminate forming step). Note that the metal electrode laminate can be formed by press work, and in this case, the unnecessary metal foil removed sheet 34 of the above-described embodiment corresponds to the metal electrode laminate.

Next, an adhesive layer laminate is formed by preliminary patterning the adhesive layer 4B onto the base material 3 (adhesive layer laminate forming step).

The patterning procedure is not particularly limited. For example, a patterning procedure in which drawing a pattern of the adhesive layer 4B by relatively moving an adhesive discharging instrument and the base material 3 while adhesive is discharged from an adhesive discharging instrument can be used.

Note that the order in which these forming steps are performed can be changed, or they can be performed in parallel.

Next, positions of the metal electrode laminate and the adhesive layer laminate are adjusted to closely contact the first surface 5a of the metal electrode 5 with the adhesive layer 4B, and left them until a predetermined adhesive strength generates (laminate adhering step). After the predetermined adhesive strength generates, he holding sheet 17 and the adhesive layer 16 (holding sheet detachment step) are detached.

Accordingly, the circuit board 2A is manufactured.

Note that all components explained in the above-described embodiment can be performed in a variety of orders or any of the components can be omitted within the spirit of the present invention.

[Second Embodiment]

Hereinafter, a metal foil pattern and a method of punching a metal foil according to the second embodiment of the present invention will be explained by reference to the FIGS. 10-19. The metal foil pattern can be obtained by punching a metal foil to a predetermined pattern, and can be used, for example, as a wiring pattern of a substrate and the like.

Figure 10:
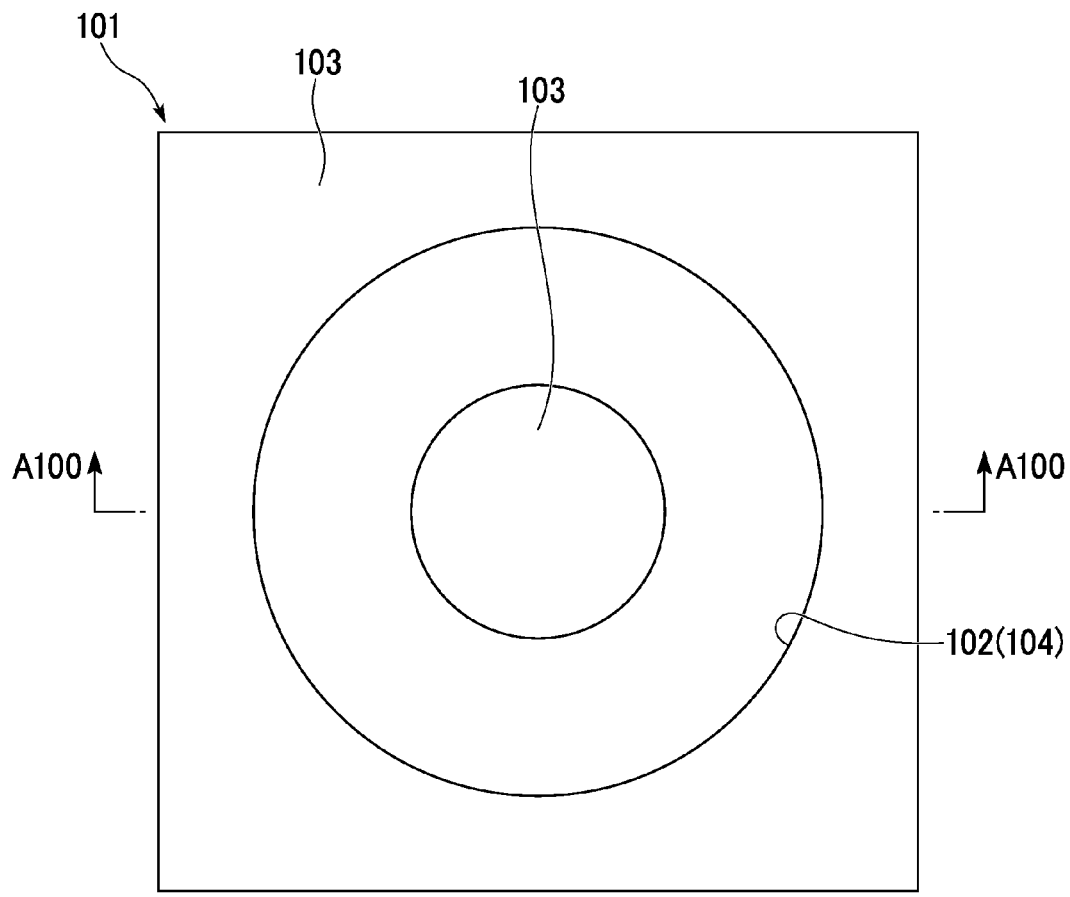
FIG. 10 is a plan view of the metal foil pattern according to the second embodiment of the present invention.
Figure 11:
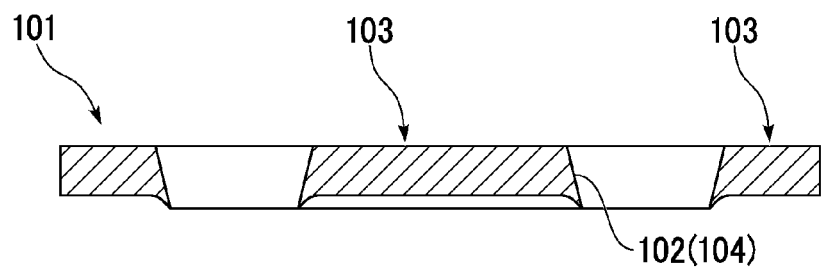
FIG. 11 is a cross-sectional view of the cutting line A100-A100 in FIG. 10.

As shown in FIGS. 10 and 11, the metal foil pattern 101 of the present embodiment is formed into a sheet with a metal, and is formed by the region 103 which requires the metal foil in which the ring-like through tube 102 is formed. As will be described below, the metal foil pattern 101 is formed by removing the region which does not require the metal foil 104, which corresponds to the shape of the through tube 102, from a metal foil.

Next, a method for punching a metal foil of the present embodiment, which manufactures the metal foil pattern 101 having the structure described above, will be explained.

Figure 12:
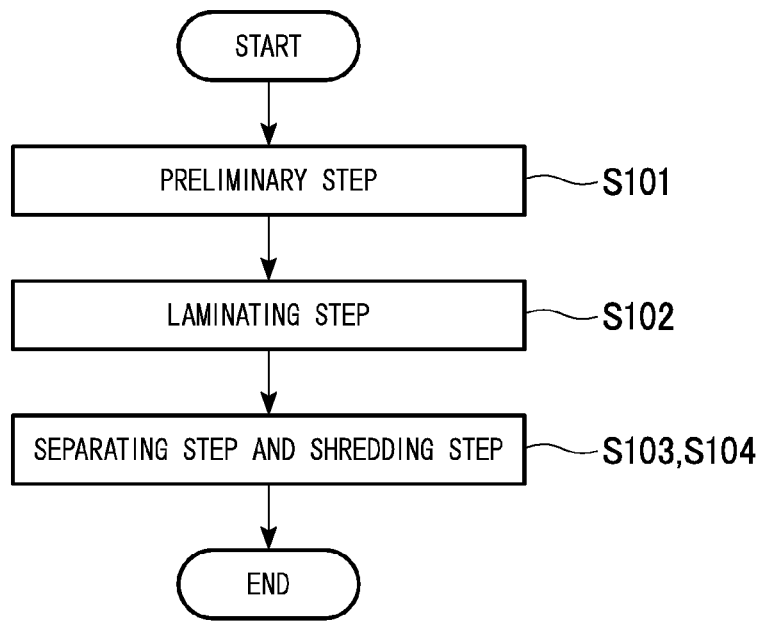
FIG. 12 is a flow chart showing the method for punching a metal foil according to the second embodiment.

As shown in the FIG. 12, the method of punching a metal foil includes the preliminary step S101 which determines a detachment length of a metal foil; the laminating step S102 to laminate the metal foil; the separating step S103 which separates a region which requires the metal foil and a region which does not require the metal foil in the metal foil; and the shredding step S104 to shred and remove the separated region which does not require the metal foil.

In the present embodiment, the separating step S103 and the shredding step S104 are performed at the same time.

Figure 13:
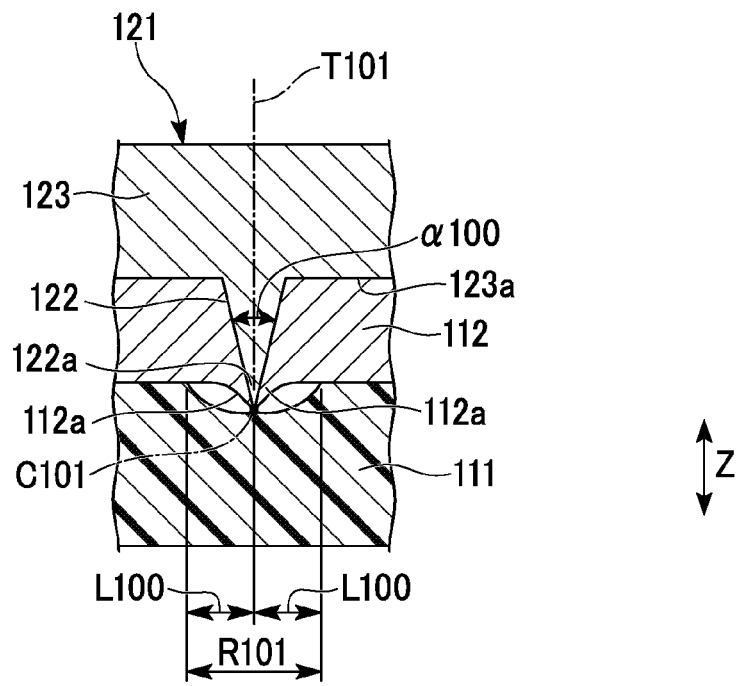
FIG. 13 is a front cross-sectional view illustrating a preliminary step in the method of punching a metal foil of the second embodiment.
Figure 14:
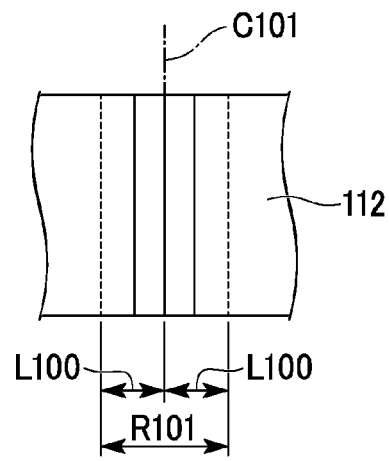
FIG. 14 is a plan view illustrating the preliminary step in the method of punching a metal foil of the second embodiment.

Firstly, as shown in the FIGS. 13 and 14, the metal foil 112 is cut in the preliminary step S101 by using a half-cut process. In the half-cut process, the tip 122a of the blade portion (punching blade) 122 of the metal mold 121 is pressed onto the metal foil 112, which is laminated on the adhesive film (adhesive layer) 111, from the side of the metal foil 112, until it reaches a middle portion in the thickness direction Z of the adhesive film 111, and then stopped. Note that the metal mold 121 is not shown in the FIG. 14 for the convenience of explanation.

For example, a structure in which a film base material is coated with a sticky material can be used as the adhesive film 111. A film thickness of a film base material is preferably 50 μm or more, since the metal foil 112 is cut using the half-cut process as mentioned above. When a film base material is thinner than 50 μm, it will be difficult to stop the tip 122a of the blade portion 122 at a middle portion in the thickness direction Z of a film base material.

The adhesive film 111 and the metal foil 112 need to be detached after the metal foil pattern 101 is formed, and therefore the sticking force of the adhesive film 111 should be set by considering not only stickiness, but also detachability.

Examples of a material that can be used to compose the metal foil 112 include copper, aluminium, nickel, brass, gold, silver, lead, and alloys thereof, but are not limited thereto. By treating a surface of the metal foil 112, close contact between the adhesive film 111 and the metal foil 112 can be changed.

The film thickness of the metal foil 112 is preferably 5 μm or more and 1 mm or less from the viewpoint of the punching property of the metal mold 121. When the film thickness of the metal foil 112 is less than 5 μm, handling of the metal foil 112 becomes difficult; however, when it is over 1 mm, punching becomes difficult. In addition, the film thickness of the metal foil 112 is preferably 200 μm or less from the viewpoint of the durability of the metal mold 121. To laminate the metal foil 112, for example, a roll-to-roll lamination process can be used.

A corrosion metal mold, a cutting metal mold and the like can be used for the metal mold 121, but is not limited thereto. Prehardened steel, quenched and tempered steel, precipitation hardening steel, tungsten carbide and cobalt alloys, other high hardness alloys, and the like can be used to form the metal mold 121, but the metal mold 121 is not limited thereto. When the metal foil 112 is punched with high-precision, the angle α 100 of the tip 122a of the blade portion 122 is preferably formed to have an acute angle. Although as the angle α 100 becomes smaller, a burr 112a and the like formed on the metal foil 112 at the time of cutting also becomes smaller, the durability of the metal mold 121 will be decreased. Generally, the angle α 100 is preferably approximately 40°-60°.

In the present embodiment, the blade portion 122 extends parallel to the bottom surface 123a of the base plate 123 of the metal mold 121, and is formed as a triangular shape symmetric about the straight line T101 that is orthogonal to the bottom surface 123a in a cross section orthogonal to a longitudinal direction.

In the half-cut process, when the tip 122a of the blade portion 122 reaches a middle portion in the thickness direction Z of the adhesive film 111, the metal foil 112 is detached from the adhesive film 111 within the predetermined area R101 whose center is the base line C101 that is defined by the tip 122a of the pushed blade portion 122 in a cross section parallel to the thickness direction Z. By contacting the bottom surface 123a of the metal mold 121 with the metal foil 112, the precision of the cutting depth by the blade portion 122 in the thickness direction Z of the adhesive film 111 can be increased.

The area R101 where the metal foil 112 is detached is unambiguously determined when the following are decided: specifications such as material (firmness) of a film base material in the adhesive film 111, the sticking force of a sticky material and the like; specifications such as the material, the thickness and the like of the metal foil 112; specifications such as the material, the shape and the like of the blade portion 122; and the depth to which the tip 122a of the blade portion 122 reaches in the thickness direction Z. Therefore, in the preliminary step S101, a test to cut the metal foil 112 with specifications identical to those used later in the separating step S103 and the shredding step S104 is performed to determine the detachment length L100 of the metal foil 112 whose center is the base line C101 in a cross section parallel to the thickness direction Z. Accordingly, the detachment length L100 of the metal foil 112 in the separating step S103 and the shredding step S104 can be estimated.

For example, when the sticking force of the adhesive film 111 becomes larger, the metal foil 112 becomes difficult to detach, and thus the detachment length L100 decreases. When the adhesive film 111 becomes hard, the burr 112a becomes smaller, and thus the detachment length L100 decreases. When the metal foil 112 is thicker, the burr 112a increases, and thus the detachment length L100 increases. When the surface roughness of the metal foil 112 is larger, the sticking force between the adhesive film 111 and the metal foil 112 increases, and thus the detachment length L100 decreases. When the angle α 100 of the blade portion 122 decreases, deformation of the metal foil 112 at the time of cutting decreases, and thus the detachment length L100 decreases.

If there are several kinds of specifications for the adhesive film 111, the metal foil 112, and the blade portion 122, similar tests are preferably repeated as changing specifications in the preliminary step S101 to preliminarily determine the detachment lengths L100 corresponding to a variety of specifications.

Figure 15:
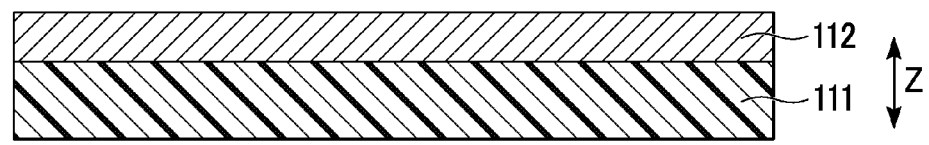
FIG. 15 is a front cross-sectional view illustrating a laminating step in the method of punching a metal foil of the second embodiment.

Next, as shown in the FIG. 15, the metal foil 112 is laminated onto the adhesive film 111 in the laminating step S102.

Figure 16:
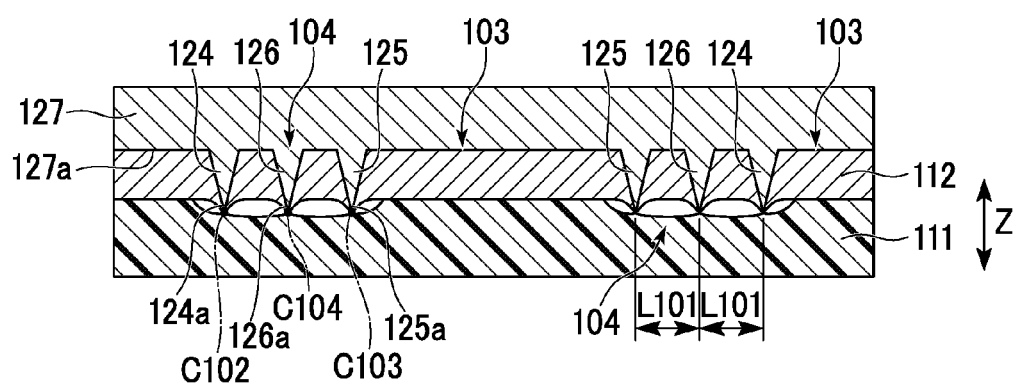
FIG. 16 is a front cross-sectional view illustrating a separating step and a shredding step in the method of punching a metal foil of the second embodiment.

Then, as shown in the FIG. 16, the blade portions (punching blades) 124, 125, and 126 are pushed onto the metal foil 112, and cut the metal foil 112 using the half-cut process in the separating step S103 and the shredding step S104. At this time, the tip 124a of the blade portion 124 and the tip 125a of the blade portion 125 are pushed onto the metal foil 112 to separate the region 103 which requires the metal foil and the region which does not require the metal foil 104 in the metal foil 112, and simultaneously the tip 126a of the blade portion 126 is pushed onto the region which does not require the metal foil 104 to finely cutting the region 104 which does not require the metal foil.

The blade portions 124, 125, and 126 are formed in to a circle form, and coaxially provided on the bottom surface 127a on the base plate 127. A cross sectional shape of each of the circularly formed blade portions 124, 125, and 126, which is parallel to the axis line thereof, is identical to that of the blade portion 122 used in the preliminary step S101. By contacting the bottom surface 127a of the base plate 127 with the metal foil 112, the depth to cut the adhesive film 111 in the thickness direction Z by the blade portions 124, 125, and 126 can be adjusted to a depth similar to that cut by the blade portion 122 used in the preliminary step S101.

In the blade portions 124, 125, and 126, the distances from the tip 126a of the blade portion 126 to the tip 124a of the adjacent blade portion 124, and to the tip 125a of the adjacent blade portion 125 are set to the distance L101 (the first length), which is a value equal to or less than twice of the detachment length L100 in a cross section parallel to the thickness direction Z at any position of the tip 126a.

Figure 17:
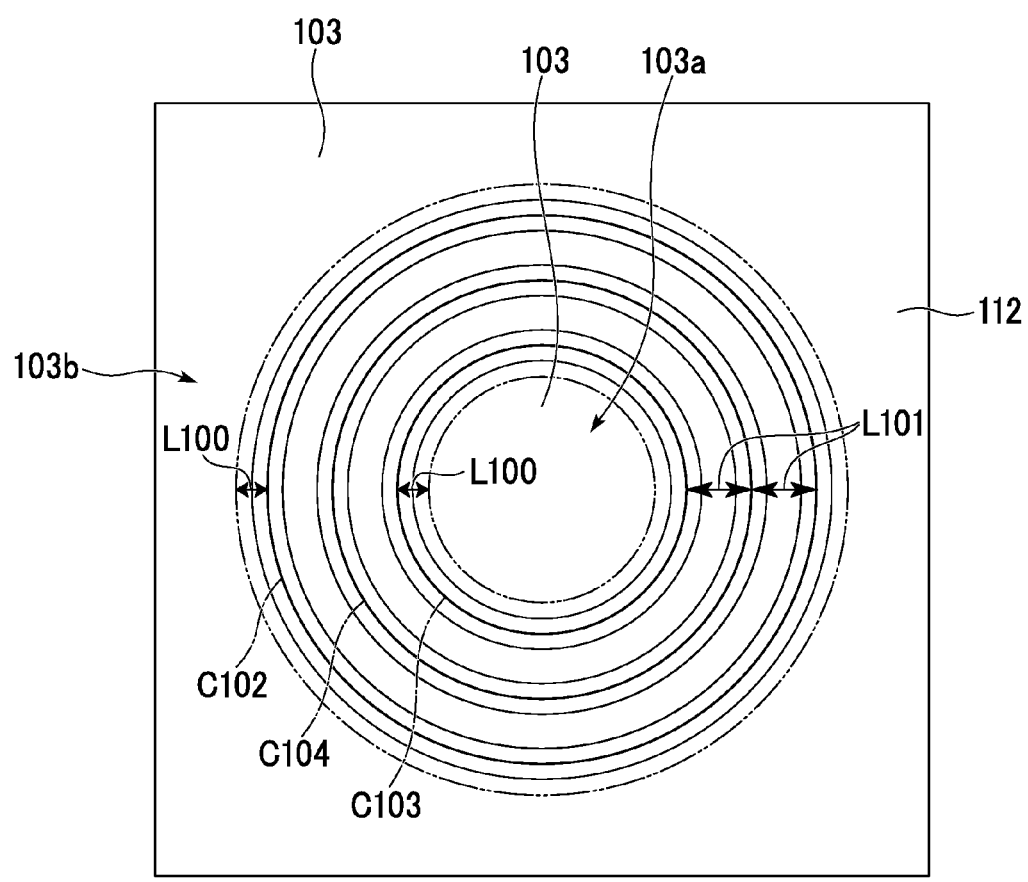
FIG. 17 is a plan view illustrating the separating step and the shredding step in the method of punching a metal foil of the second embodiment.

In addition as shown in the FIG. 17, the minimum value of the distance between the adjacent separating lines C103 is set to be larger than the detachment length L100 in a cross section vertical to the thickness direction Z of the region 103 which requires metal foil. The metal foil 112 has the non-detachment region 103a that is not detached from the adhesive film 111 in the separating step S103. Note that the base plate 127 and the blade portions 124, 125, and 126 are not shown in the FIG. 17 for the convenience of explanation.

Similarly, the region 103 which requires the metal foil has the non-detachment region 103b in which the minimum value of the distance from the adjacent separating lines C102 is set to be larger than the detachment length L100.

As shown in the FIGS. 16 and 17, the blade portion 124 cuts the metal foil 112 in a cross section that is parallel to the thickness direction Z, along the separating line C102 defined by the tip 124a of the pushed blade portion 124, and detaches the metal foil 112 from the adhesive film 111 by setting the separating line C102 as the center of the detachment region. Similarly, the blade portion 125 cuts the metal foil 112 along the separating line C103 defined by the tip 125a, and detaches the metal foil 112 from the adhesive film 111 by setting the separating line C103 as the center of the detachment region.

In addition, the blade portion 126 cuts the region 104 which does not require the metal foil in a cross section that is parallel to the thickness direction Z, along the shredding line C104 defined by the tip 126a of the pushed blade portion 126, and detaches the region 104 which does not require the metal foil from the adhesive film 111 by setting the shredding line C104 as the center of the region 104 which does not require the metal foil.

Accordingly, in the metal foil 112, a region in the area of the detachment length L100 is detached in a cross section that is parallel to the thickness direction Z, by setting each of the separating lines C102, C103, or the shredding line C104 as the center of the detachment region.

The blade portions 124, 125, and 126 are formed as described above, and thus after cutting of the metal foil 112 by the blade portions 124, 125, and 126, the distance from the shredding line C104 to the adjacent separating lines C102 or C103 in a cross section that is parallel to the thickness direction Z is the distance L101 at any portion of the shredding line C104.

Accordingly, portions detached by each of the blade portions 124, 125, and 126 can be connected. It means that the entire region 104 which does not require the metal foil is detached from the adhesive film 111.

For example, when the detachment length L100 is 250 μm, if the distance from the shredding line C104 to the adjacent separating lines C102 or C103, i.e., the width of each of the regions 104 which do not require the metal foil that will be shredded, is 500 μm or less, the entire region 104 which does not require the metal foil is detached from the adhesive film 111.

Figure 18:
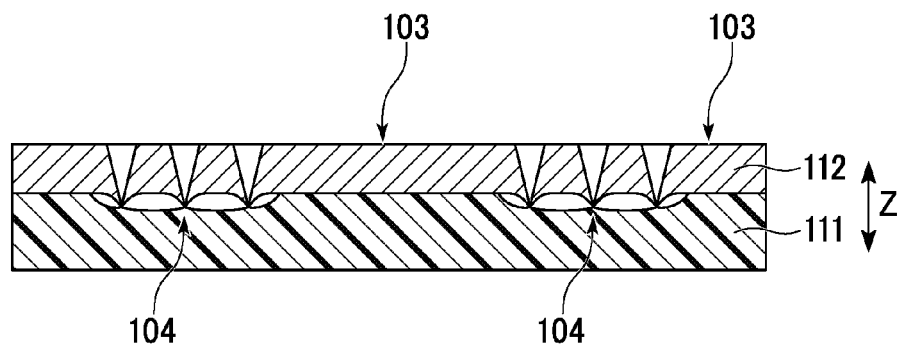
FIG. 18 is a front cross-sectional view showing the state of an adhesive film and a metal foil in the method of punching a metal foil of the second embodiment, wherein a metal foil is removed from a metal mold.
Figure 19:
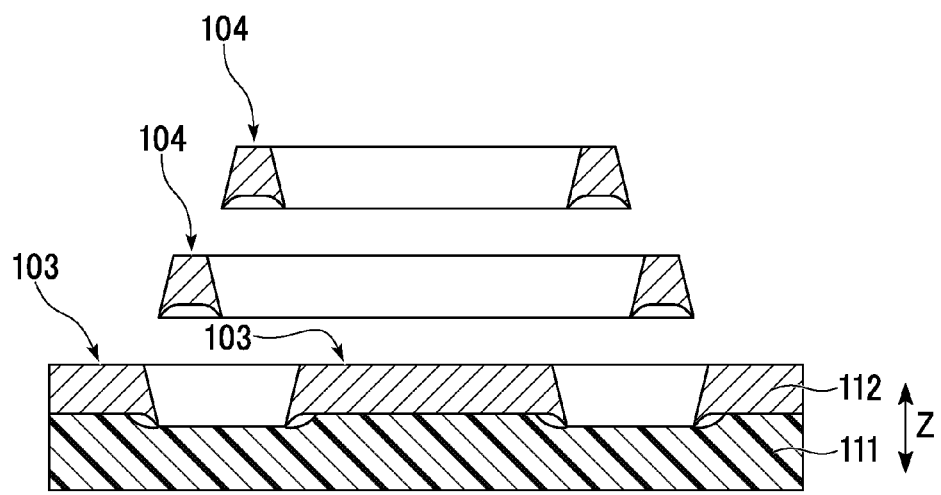
FIG. 19 is a front cross-sectional view showing the state of an adhesive film and a metal foil in the method of punching a metal foil of the second embodiment, wherein a region which does not require the metal foil is removed from an adhesive film.

After that, by removing the metal mold from the metal foil 112 as shown in the FIG. 18, and reversing the adhesive film 111, and the like, the region 104 which does not require the metal foil is removed from the adhesive film 111 as shown in the FIG. 19.

Next, by removing the adhesive film 111 from the region 103 which requires the metal foil by a known method, the metal foil pattern 101 formed by the region 103 which requires the metal foil shown in the FIGS. 10 and 11 is manufactured.

As explained above, according to the punching method of the metal foil pattern 101 and the metal foil 112 of the present embodiment, the preliminary step S101 is first performed to determine the detachment length L100 of the metal foil 112. Then, the region 104 which does not require the metal foil is cut in the shredding step S104 so that the distance from the shredding line C104 to the adjacent separating lines C102 or C103 in a cross section that is parallel to the thickness direction Z is the distance L101, which is a value equal to or less than twice of the detachment length L100. Accordingly, portions detached by each of the blade portions 124, 125, and 126 are connected. That is, the entire region 104 which does not require the metal foil is detached from the adhesive film 111. Thus, the region 104 which does not require the metal foil can be easily removed from the adhesive film 111.

Accordingly, the yield rate to manufacture the metal foil pattern 101 is increased, and thereby the production cost of the metal foil pattern 101 can be reduced.

In the separating step S103, when the region 103 which requires the metal foil and the region 104 which does not require the metal foil are separated, the non-detachment regions 103a and 103b in the region 103 which requires the metal foil are not detached from the adhesive film 111. Therefore, the region 103 which requires the metal foil can be prevented from being detached together with the region 104 which does not require the metal foil.

The tip of each of the blade portions 124, 125, and 126 is formed to have an acute angle. Therefore, deformation of the metal foil 112 will be decreased when the metal foil 112 is cut, and the detachment length L100 can reduced.

Also, the separating step S103 and the shredding step S104 are performed at the same time in the present embodiment, and thus the metal foil pattern 101 can be manufactured within a shorter time.

When a blade portion of a metal mold is pushed onto the metal foil 112, the metal foil 112 is cut. At that time, it is difficult to cut the metal foil 112 so that a cross section is completely vertical to a surface of the metal foil 112. The metal foil 112 is gradually deformed by pushing down a blade portion, and then is broken and cut. The shape of the cutting surface varies depending on the shape of a tip of blade portion and an angle between a blade portion and the metal foil 112, and for example, the burr 112a of approximately several to several dozen micrometers is formed from the metal foil 112 toward the adhesive film 111. A metal foil pattern having such a burr is generally deemed to be defective, and thus punching methods avoiding burr formation as much as possible have been developed.

In addition, defects, in which the metal foil 112 is detached from the adhesive film 111 by the burr 112a that is formed on the metal foil 112 by cutting, has been observed. Even if formation of the burr 112a is minimized, when the sticking force of the adhesive film 111 is weaker, the metal foil 112 is detached from the adhesive film 111 by approximately several hundred micrometers, in proximity of a portion where the metal foil 112 is cut. The present embodiment utilizes such a detachment between the metal foil 112 and the adhesive film 111, and the entire region 104 which does not require the metal foil can be detached from the adhesive film 111 by shredding the region 104 which does not require the metal foil with a metal mold.

Although the embodiment of the present invention has been detailed above by reference to the figures, a tangible structure is not limited to this embodiment, and changes to the structure and the like within a scope that does not depart from the argument of the present invention can also be included.

For example, in a punching method of the metal foil 112, the burr 112a of the metal foil 112 can also be removed by adding a post-process such as etching. According to that, the metal foil pattern 101 can be a smooth shape without much irregularity.

When the width of the region 104 which does not require the metal foil (the distance between the separating lines C102 and C103) is larger, two or more blade portions can be placed between the blade portions 124 and 125.

The manufactured metal foil pattern 101 can be re-transcribed onto a base material that is not shown in the figures. For a re-transcription, a method for an adhesive transcription, in which a base material is coated with an adhesive, and the like can be used, but is not limited thereto. In addition, by transcribing the metal foil pattern 101 so that the metal foil pattern 101 is embedded inside of an insulating resin, a resin embedding metal wiring can be formed.

The price of a metal mold generally varies depending on the shape and the length of a blade portion, and thus when a number of blade portions are needed to finely shred the region which does not require the metal foil, the length of the blade portion is preferably designed to be as short as possible.

In the above-described embodiment, the distance between the non-detachment region 103a of the region 103 which requires the metal foil and the separating line C103 is longer than the detachment length L100, and by setting this distance as a value that is twice the detachment length L100, the region which 103 requires the metal foil can be more certainly prevented from being removed together with the region 104 which does not require the metal foil.

In the above-described embodiment, the separating step S103 and the shredding step S104 are performed at the same time. However, the order of these steps is not limited, and thus the shredding step S104 can be performed after the separating step S103, or the separating step S103 can be performed after the shredding step S104. In addition, in the shredding step S104, the region which does not require the metal foil can be cut multiple times.

Note that the metal foil pattern and the method for punching a metal foil according to the above-described second embodiment can be applied to the metal electrode 5 and the production thereof in the above-described first embodiment.

[Third Embodiment]

Hereinafter, a metal foil pattern laminate and a method of punching a metal foil according to the third embodiment of the present invention will be explained by reference to the FIGS. 20-29. In the metal foil pattern laminate, a metal foil punched in a predetermined pattern is provided on a base material through a stepwise-curing type adhesive layer. The metal foil pattern laminate can be used, for example, as a wiring pattern of a substrate and the like.

Figure 20:
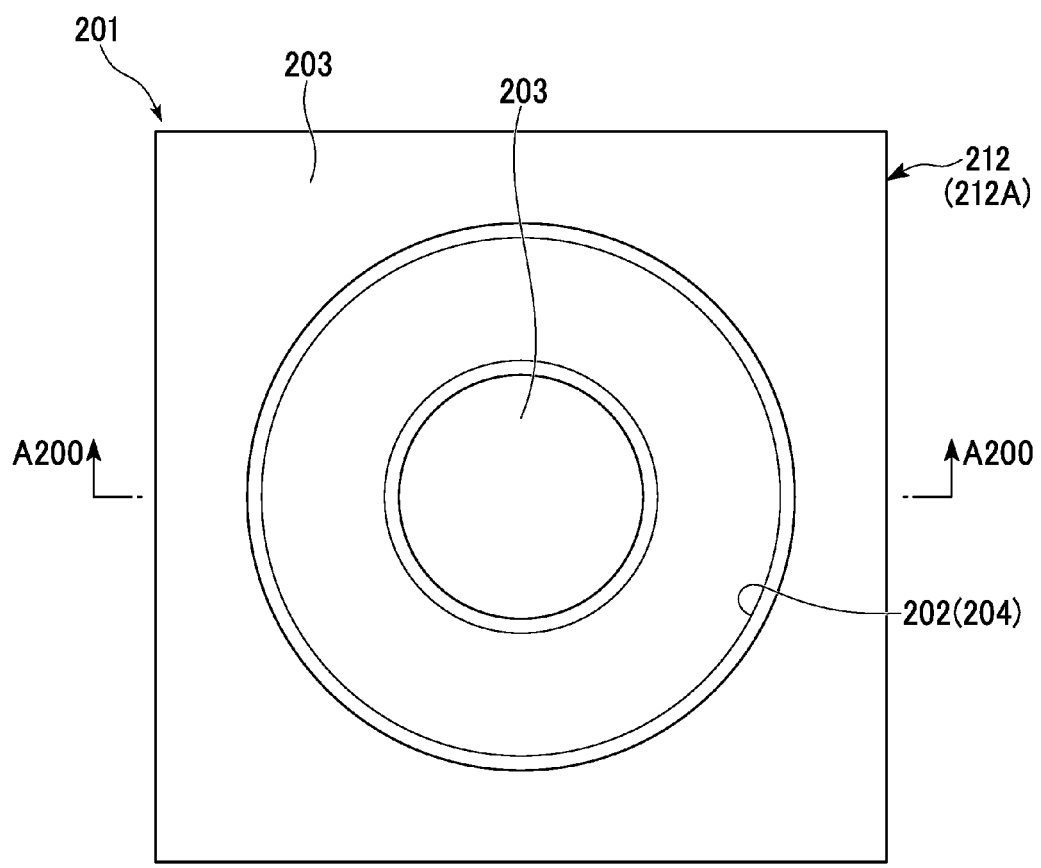
FIG. 20 is a plan view of the metal foil pattern laminate according to a third embodiment of the present invention.
Figure 21:
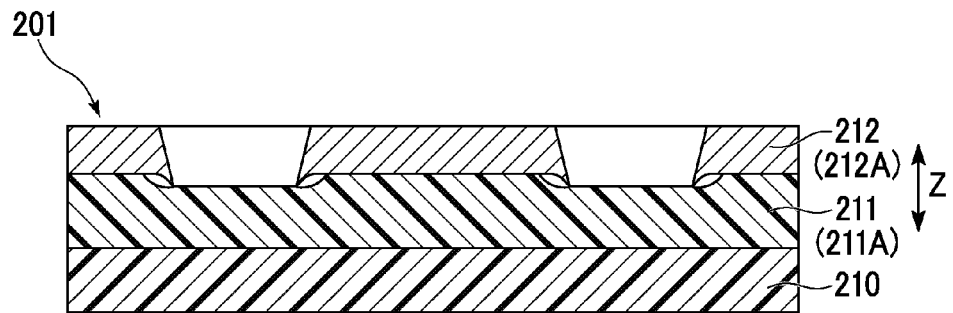
FIG. 21 is a cross-sectional view of a metal foil pattern laminate along the cutting line A200-A200 in FIG. 20.

As shown in the FIGS. 20 and 21, the metal foil pattern laminate 201 of the present embodiment has the base material 210, the stepwise-curing type adhesive layer 211 provided on the base material 210, and the metal foil pattern 212 provided on the stepwise-curing type adhesive layer 211.

The base material 210 is formed in the shape of a film or plate. As a material of the base material 210, acryl, polycarbonate, polyethylene terephthalate, polyethylene naphthalate, polyimide, urethane, epoxy, melamine, styrene, or copolymerized resins thereof can be used. To control adiabaticity, elasticity, and optical property, organic or inorganic filler and the like can be mixed in the base material 210 if desired. Also, when a metal foil pattern is formed onto a solar cell back sheet, the base material 210 can be used as the solar cell back sheet. In this case, a metal thin film or a composite laminate film of a metal thin film and the resin, which has humidity shielding property or oxygen shielding property, can be used for the base material 210.

The stepwise-curing type adhesive layer 211 is formed by heating and curing a heat-hardening resin, such as urethane, acryl, epoxy, polyimide, olefin, or the stepwise-curing type adhesive 211A that is a copolymer thereof.

As a material to compose the metal foil pattern 212, the metal foil 212A that is formed sheet-like with copper, aluminium, nickel, brass, gold, silver, lead, as well as alloys thereof is cut with a metal mold that will be described below, and thereby the metal foil pattern 212 can be formed. In addition to the above, desired metals can be used as a material composing the metal foil pattern 212.

As shown in the FIG. 20, the metal foil pattern 212 is formed by the region 203 which requires the metal foil in which the ring-like through tube 202 is formed. As will be described below, the metal foil pattern 212 is formed by removing the region 204 which does not require the metal foil, which corresponds to the shape of the through tube 202, from the metal foil 212A.

The film thickness of the metal foil 212A is preferably 5 μm or more and 1 mm or less when the punching property of a metal mold is considered. When the film thickness of the metal foil 212A is less than 5 μm, handling of the metal foil 212A becomes difficult; however, when it is over 1 mm, punching becomes difficult. In addition, the film thickness of the metal foil 212A is preferably 200 μm or less when the durability of the metal mold is considered.

Also, by treating the surface of the metal foil pattern 212, close contact between the stepwise-curing type adhesive layer 211 and the metal foil pattern 212 can be changed.

Next, a method of punching a metal foil of the present embodiment, which is for manufacturing the metal foil pattern laminate 201 having the above-described structure, will be explained.

Figure 22:
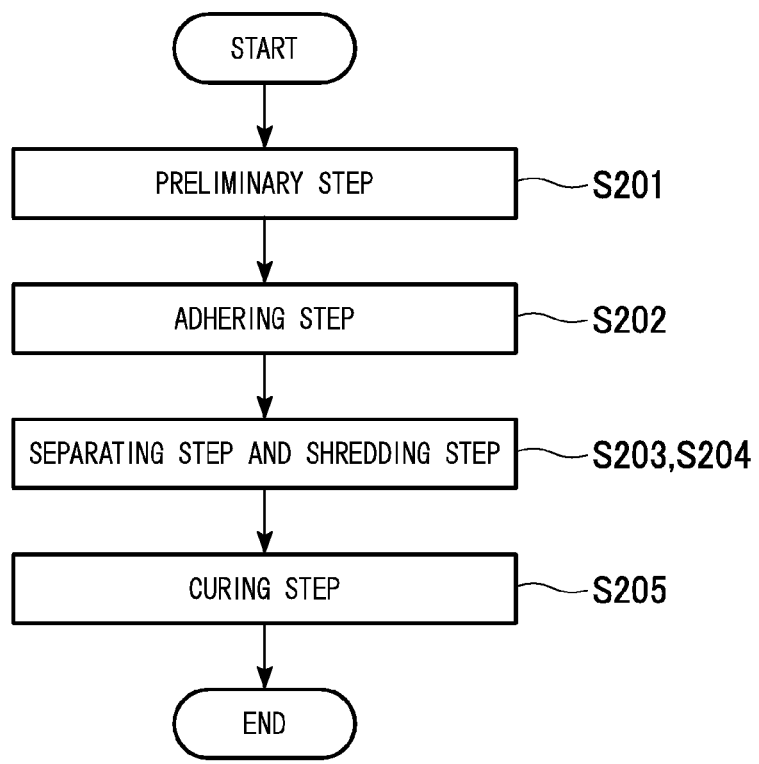
FIG. 22 is a flow chart showing the method of punching a metal foil according to the third embodiment.

As shown in the FIG. 22, the method of punching a metal foil includes the preliminary step S201 to determine a detachment length of the metal foil 212A; the adhering step S202 in which the base material 210 and the metal foil 212A are adhered through the stepwise-curing type adhesive 211A; the separating step S203 to separate the region 203 which requires the metal foil and the region 204 which does not require the metal foil in the metal foil 212A; the shredding step S204 to shred and remove the separated region 204 which does not require the metal foil; and the curing step S205 to cure the stepwise-curing type adhesive 211A.

In the present embodiment, the separating step S203 and the shredding step S204 are performed at the same time.

Figure 23:
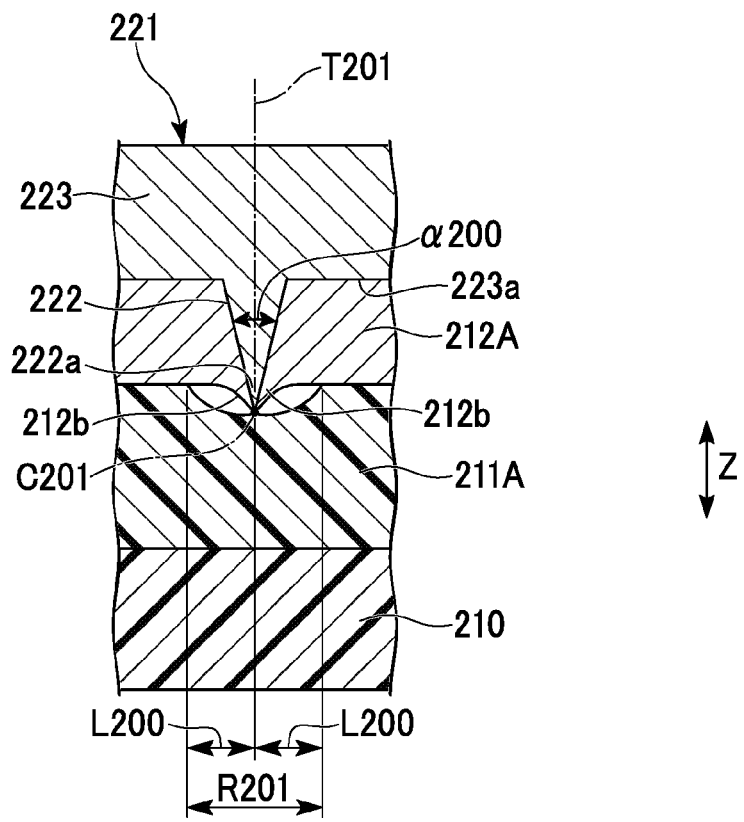
FIG. 23 is a front cross-sectional view illustrating a preliminary step in the method of punching a metal foil of the third embodiment.
Figure 24:
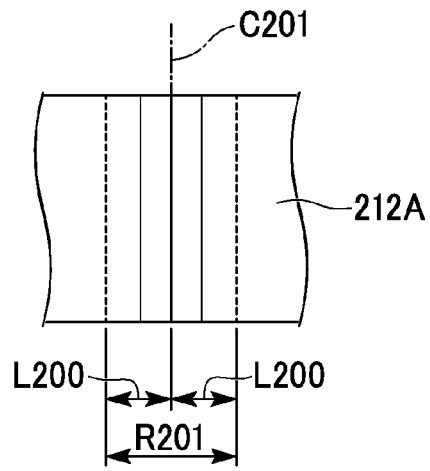
FIG. 24 is a plan view illustrating the preliminary step in the method of punching a metal foil of the third embodiment.
Figure 25:
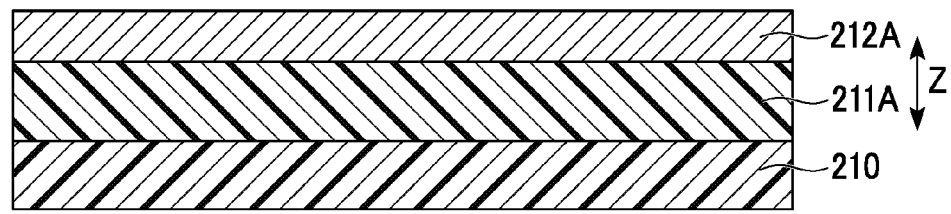
FIG. 25 is a front cross-sectional view illustrating an adhering step in the method of punching a metal foil of the third embodiment.

Firstly, as shown in the FIGS. 23 and 24, the metal foil 212A is cut in the preliminary step S201 using a half-cut process. In the half-cut process, the tip 222a of the blade portion (punching blade) 222 of the metal mold 221 is pressed onto the metal foil 212A, which is adhered onto the base material 210 through the stepwise-curing type adhesive 211A, from the side of the metal foil 212A, until it reaches a middle portion in the thickness direction Z of the stepwise-curing type adhesive 211A, and is then stopped. Note that the metal mold 221 is not shown in the FIG. 24 for the convenience of explanation.

For example, a structure in which the base material 210 is coated with a sticky material can be used as the stepwise-curing type adhesive 211A. The film thickness of the base material 210 is preferably 50 μm or more, since the metal foil 212A is cut by the half-cut process as mentioned above. When the base material 210 is thinner than 50 μm, it will be difficult to stop the tip 222a of the blade portion 222 at a middle portion in the thickness direction Z of the base material 210.

The stepwise-curing type adhesive 211A and the region 204 which does not require the metal foil in the metal foil 212A need to be detached after the metal foil pattern 212 is formed, and therefore the sticking force of the stepwise-curing type adhesive 211A should be set by considering not only stickiness, but also detachability.

The adhesive force between the stepwise-curing type adhesive 211A and the metal foil 212A in the 180° detachment test defined by JIS K6854-2 is preferably 0.05 N/cm or more and 1.0 N/cm or less.

A corrosion metal mold, cutting metal mold and the like can be used for the metal mold 221, but is not limited thereto. Glass, prehardened steel, quenched and tempered steel, precipitation hardening steel, alloy of tungsten carbide and cobalt, other high hardness alloys and the like can be used to form the metal mold 221, but is not limited thereto. When the metal foil 212A is punched with high-precision, the angle α 200 of the tip 222a of the blade portion 222 is preferably formed to have an acute angle. As the angle α 200 decreases, a burr 212b and the like formed on the metal foil 212A at the time of cutting also decreases, and the durability of the metal mold 221 will be decreased. Generally, the angle α 200 is preferably approximately 40°-60°.

In the present embodiment, the blade portion 222 extends parallel with the bottom surface 223a of the base plate 223 of the metal mold 221, and is formed as a triangular shape symmetric about the straight line T201 that is orthogonal to the bottom surface 223a in a cross section orthogonal to a longitudinal direction.

In the half-cut process, when the tip 222a of the blade portion 222 reaches a middle portion in the thickness direction Z of the stepwise-curing type adhesive 211A, the metal foil 212A is detached from the stepwise-curing type adhesive 211A within the predetermined area R201 whose center is the base line C201 that is defined by the tip 222a of the pushed blade portion 222 in a cross section parallel to the thickness direction Z. By contacting the bottom surface 223a of the metal mold 221 with the metal foil 212A, precision of a cutting depth by the blade portion 222 in the thickness direction Z of the stepwise-curing type adhesive 211A can be increased.

The area R201 where the metal foil 212A is detached is unambiguously determined when followings are decided: specifications such as the material (firmness) of the stepwise-curing type adhesive 211A, the sticking force of the stepwise-curing type adhesive 211A and the like; specifications such as the material, the thickness and the like of the metal foil 212A; specifications such as the material, the shape and the like of the blade portion 222; and the depth to which the tip 222a of the blade portion 222 reaches in the thickness direction Z. Therefore, in the preliminary step S201, a test to cut the metal foil 212A with specifications identical to those used later in the separating step S203 and the shredding step S204 is performed to determine the detachment length L200 of the metal foil 212A whose center is the base line C201 in a cross section parallel to the thickness direction Z. Accordingly, the detachment length L200 of the metal foil 212A in the separating step S203 and the shredding step S204 can be estimated.

For example, when the sticking force of the stepwise-curing type adhesive 211A increases, the metal foil 212A becomes difficult to detach, and thus the detachment length L200 decreases. When the stepwise-curing type adhesive 211A becomes hard, the burr 212b decreases, and thus the detachment length L200 decreases. When the metal foil 212A is thicker, the burr 212b increases, and thus the detachment length L200 increases. When the surface roughness of the metal foil 212A is larger, the sticking force between the stepwise-curing type adhesive 211A and the metal foil 212A increases, and thus the detachment length L200 decreases. When the angle α 200 of the blade portion 222 decreases, deformation of the metal foil 212A at the time of cutting decreases, and thus the detachment length L200 decreases.

If there are several kinds of specifications for the stepwise-curing type adhesive 211A, the metal foil 212A, and the blade portion 222, similar tests are preferably repeated while specifications are changed in the preliminary step S201 to preliminary determine the detachment lengths L200 corresponding to a variety of specifications.

Next, in the adhering step S202, one of the base material 210 and the metal foil 212A is coated with the stepwise-curing type adhesive 211A, and another of the base material 210 and the metal foil 212A is placed on the stepwise-curing type adhesive 211A. Thus as shown in the FIG. 25, the base material 210 and the metal foil 212A are adhered through the stepwise-curing type adhesive 211A.

Figure 26:
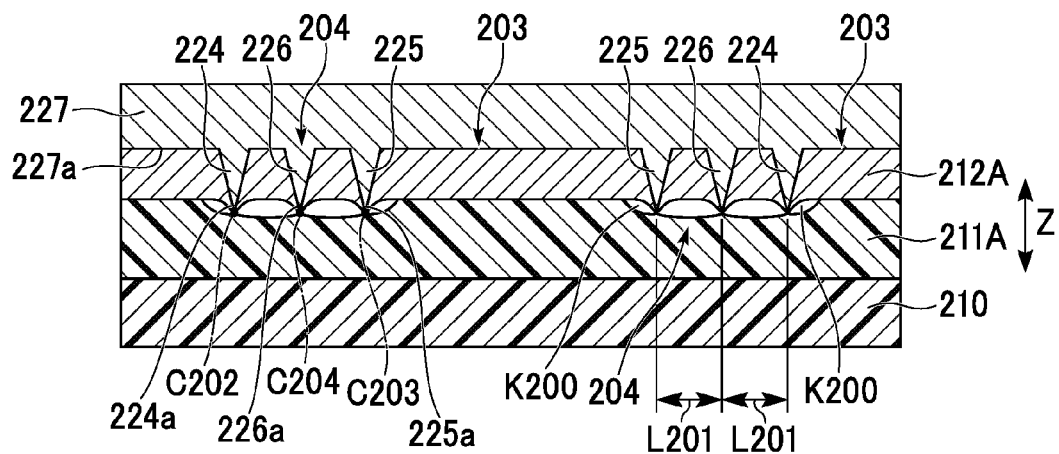
FIG. 26 is a front cross-sectional view illustrating a separating step and a shredding step in the method of punching a metal foil of the third embodiment.

Then, as shown in the FIG. 26, the blade portions (punching blades) 224, 225, and 226 are pushed onto the metal foil 212A, and cut the metal foil 212A by the half-cut process in the separating step S203 and the shredding step S204. At this time, the tip 224a of the blade portion 224 and the tip 225a of the blade portion 225 are pushed onto the metal foil 212A to separate the region 203 which requires the metal foil and the region 204 which does not require the metal foil in the metal foil 212A, and simultaneously the tip 226a of the blade portion 226 is pushed onto the region 204 which does not require the metal foil to finely cut the region 204 which does not require the metal foil.

The blade portions 224, 225, and 226 are formed as a circle, and are coaxially provided on the bottom surface 227a on the base plate 227. A cross sectional shape of each of the circularly formed blade portions 224, 225, and 226, which are parallel to the axis line thereof, is identical to that of the blade portion 222 used in the preliminary step S201. By contacting the bottom surface 227a of the base plate 227 with the metal foil 212A, the depth to cut the stepwise-curing type adhesive 211A in the thickness direction Z by the blade portions 224, 225, and 226 can be adjusted to a depth similar to that cut by the blade portion 222 used in the preliminary step S201.

In the blade portions 224, 225, and 226, distances from the tip 226a of the blade portion 226 to the tip 224a of the adjacent blade portion 224, and to the tip 225a of the adjacent blade portion 225 are set to a distance L201 (the second length), which is a value equal to or less than twice the detachment length L200 in a cross section parallel to the thickness direction Z at any positions of the tip 226a.

Figure 27:
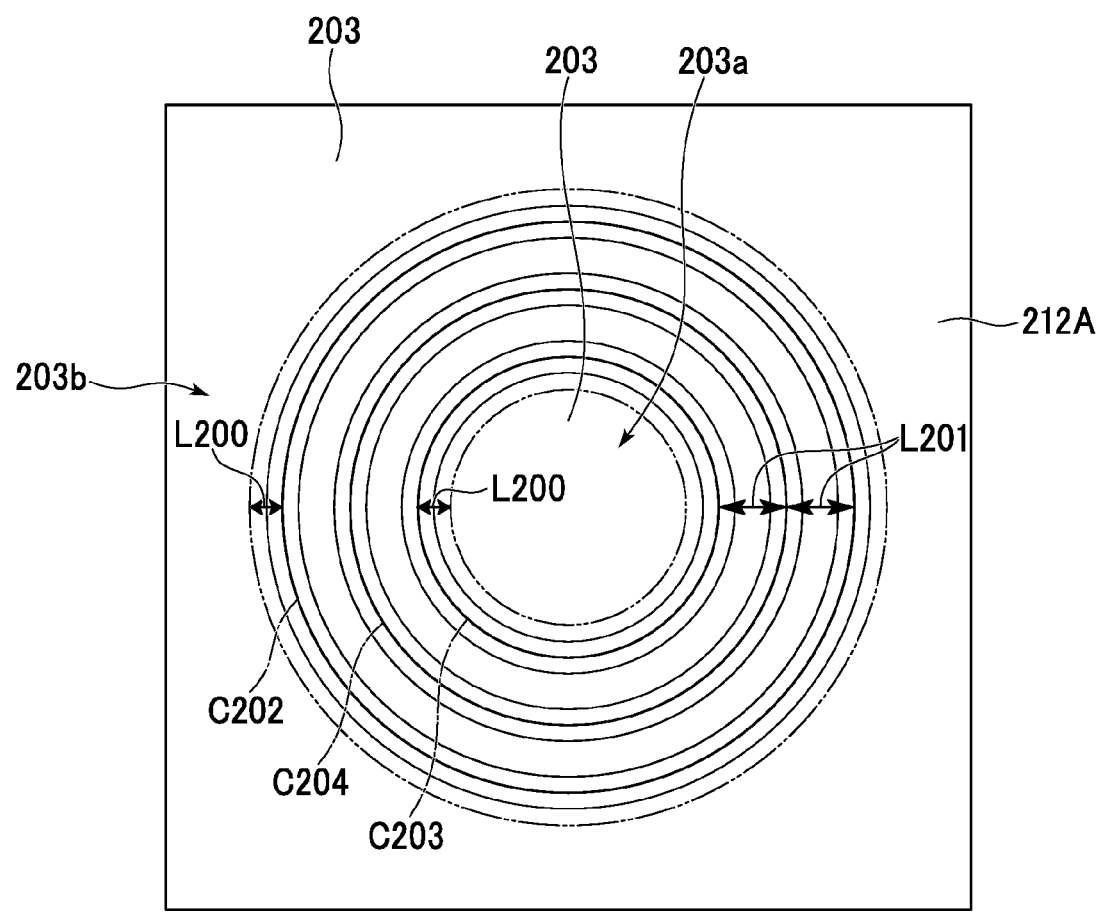
FIG. 27 is a plan view illustrating the separating step and the shredding step in the method of punching a metal foil of the third embodiment.
Figure 28:
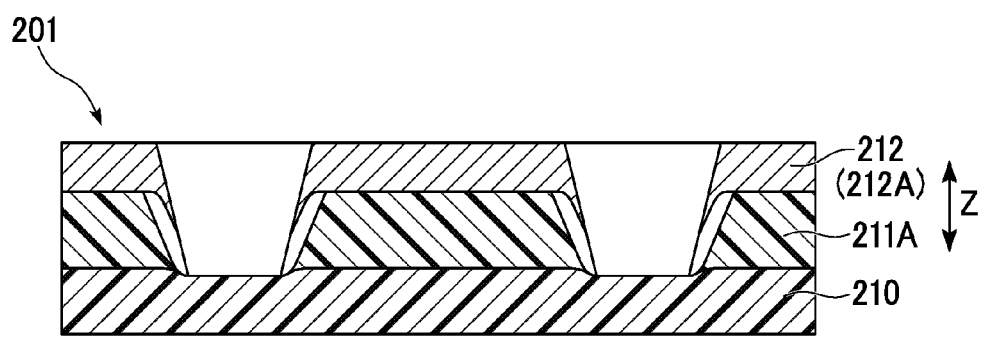
FIG. 28 is a front cross-sectional view illustrating a separating step and a shredding step in the method of punching a metal foil according to a modified example of the third embodiment.

In addition as shown in the FIG. 27, the minimum value of the distance between the adjacent separating lines C203 is set to be larger than the detachment length L200 in a cross section vertical to the thickness direction Z of the region 203 which requires the metal foil. The metal foil 212 has the non-detachment region 203a that is not detached from the stepwise-curing type adhesive 211A in the separating step S203. The separating line C203 will be described below. Note that the base plate 227 and the blade portions 224, 225, and 226 are not shown in the FIG. 27 for convenience of explanation.

Similarly, the region 203 which requires the metal foil has a non-detachment region 203b in which the minimum value of the distance from the adjacent separating lines C202, which will be described below, is set to be larger than the detachment length L200.

As shown in the FIGS. 26 and 27, the blade portion 224 cuts the metal foil 212A in a cross section that is parallel to the thickness direction Z, along the separating line C202 defined by the tip 224a of the pushed blade portion 224, and detaches the metal foil 212A from the stepwise-curing type adhesive 211A by setting the separating line C202 as the center of the detachment region. Similarly, the blade portion 225 cuts the metal foil 212A along the separating line C203 defined by the tip 225a, and detaches the metal foil 212A from the stepwise-curing type adhesive 211A by setting the separating line C203 as the center of the detachment region.

In addition, the blade portion 226 cuts the region 204 which does not require the metal foil in a cross section that is parallel to the thickness direction Z, along the shredding line C204 defined by the tip 226a of the pushed blade portion 226, and detaches the region 204 which does not require the metal foil from the stepwise-curing type adhesive 211A by setting the shredding line C204 as the center of the region 204 which does not require the metal foil.

Accordingly, in the metal foil 212A, a region in the area of the detachment length L200 is detached in a cross section that is parallel to the thickness direction Z, by setting each of the separating lines C202, C203, or the shredding line C204 as the center of the detachment region.

The blade portions 224, 225, and 226 are formed as described above, and thus after cutting the metal foil 212A using the blade portions 224, 225, and 226, the distance from the shredding line C204 to the adjacent separating lines C202 or C203 in a cross section that is parallel to the thickness direction Z is the distance L201 at any portions of the shredding line C204.

Accordingly, portions detached by each of the blade portions 224, 225, and 226 can be connected. It means that the entire region 204 which does not require the metal foil is detached from the stepwise-curing type adhesive 211A.

For example, when the detachment length L200 is 250 μm, if the distance from the shredding line C204 to the adjacent separating lines C202 or C203, i.e., the width of each of the region 204 which does not require the metal foil that will be shredded, is 500 μm or less, the entire region 204 which does not require the metal foil are detached from the stepwise-curing type adhesive 211A.

After that, by removing the metal mold from the metal foil 212A, and reversing the stepwise-curing type adhesive 211A, and the like, the region 204 which does not require the metal foil is removed from the stepwise-curing type adhesive 211A as shown in the FIGS. 20 and 21, and thereby the metal foil pattern 212, in which the metal foil 212A consists only of the region 203 which requires the metal foil, can be obtained.

In addition, the stepwise-curing type adhesive 211A is cured by heating in the curing step S205. Accordingly, the stepwise-curing type adhesive 211A becomes the stepwise-curing type adhesive layer 211. The adhesive strength of the stepwise-curing type adhesive layer 211 to the base material 210 and the metal foil pattern 212 is stronger than that of the stepwise-curing type adhesive 211A.

Note that an adhesive force between the stepwise-curing type adhesive layer 211 and the metal foil pattern 212 (metal foil 212A) in the aforementioned 180° detachment test is preferably 3.0 N/cm or more. An adhesive force between the stepwise-curing type adhesive layer 211 and the metal foil pattern 212 can be adjusted by adjusting the thicknesses of the stepwise-curing type adhesive layer 211, the metal foil pattern 212, and the base material 210, or by adjusting the level of thermal curing of the stepwise-curing type adhesive 211A.

The obtained stepwise-curing type adhesive layer 211 preferably loses surface tackiness (stickiness). To lose surface tackiness of the stepwise-curing type adhesive layer 211, for example, a method in which the stepwise-curing type adhesive 211A, which is a heat-hardening resin, is cross-linked until its molecular weight becomes sufficiently increased, and then cured, can be used.

As explained above, according to the punching method of the metal foil pattern laminate 201 and the metal foil 212A of the present embodiment, the preliminary step S201 to determine the detachment length L200 of the metal foil 212A is first performed. Then, cutting of the region 204 which does not require the metal foil is performed in the shredding step S204 so that the distance from the shredding line C204 to the adjacent separating lines C202 or C203 in a cross section that is parallel to the thickness direction Z is the distance L201, which is a value equal to or less than twice the detachment length L200. Accordingly, portions detached by each of the blade portions 224, 225, and 226 are connected. That is, the entire region 204 which does not require the metal foil is detached from the stepwise-curing type adhesive 211A. Thus, the region 204 which does not require the metal foil can be easily removed from the stepwise-curing type adhesive 211A.

Thus, when a half-cut process is performed, not only misalignment of a metal foil 212A is prevented by the stepwise-curing type adhesive 211A, but also the metal foil pattern 212 is certainly held with a sticking force of the stepwise-curing type adhesive layer 211 in the curing step S205.

Accordingly, the yield rate for manufacturing the metal foil pattern laminate 201 is increased, and thereby the production cost of the metal foil pattern laminate 201 can be reduced.

In the above-described embodiment, the adhesive force as measured by the 180° detachment test is 0.05 N/cm or more and 1.0 N/cm or less for the stepwise-curing type adhesive 211A, and 3.0 N/cm or more for the stepwise-curing type adhesive layer 211. Accordingly, not only is the region 204 which does not require the metal foil detached more easily from the stepwise-curing type adhesive 211A, but also the metal foil pattern 212 is held more certainly by the stepwise-curing type adhesive layer 211.

Because the stepwise-curing type adhesive 211A has lost surface tackiness, the metal foil pattern laminates 201 can be easily handled.

In the separating step S203, when the region 203 which requires the metal foil and the region 204 which does not require the metal foil are separated, the non-detachment regions 203a and 203b in the region 203 which requires the metal foil are not detached from the stepwise-curing type adhesive 211A. Therefore, the region 203 which requires the metal foil can be prevented from being detached together with the region 204 which does not require the metal foil.

The tip of each of the blade portions 224, 225, and 226 is formed to have an acute angle. Therefore, deformation of the metal foil 212A will be decreased when the metal foil 212A is cut, and the detachment length L200 can be decreased.

Also, the separating step S203 and the shredding step S204 are performed at the same time in the present embodiment, and thus the metal foil pattern laminates 201 can be manufactured within a shorter time.

When a blade portion of a metal mold is pushed onto the metal foil 212A, the metal foil 212A is cut. At that time, it is difficult to cut the metal foil 212A so that a cross section is completely vertical to a surface of the metal foil 212A. The metal foil 212A is gradually deformed by pushing a blade portion, and then is broken and cut. The shape of cutting surface is varied depending on the shape of a tip of blade portion and the angle between a blade portion and the metal foil 212A, and for example, a burr 212b of approximately several to several dozen micrometers is formed from the metal foil 212A toward the stepwise-curing type adhesive 211A. A metal foil pattern having such a burr is generally deemed to be defective, and thus punching methods avoiding burr formation as much as possible have been developed.

In addition, defects, in which the metal foil 212A is detached from the stepwise-curing type adhesive 211A by the burr 212b that is formed on the metal foil 212A by cutting, have been observed. Even if formation of the burr 212b is minimized, when the sticking force of the stepwise-curing type adhesive 211A is weaker, the metal foil 212A is detached from the stepwise-curing type adhesive 211A by approximately several hundred micrometers, in proximity of a portion where the metal foil 212A is cut. The present embodiment utilizes such a detachment between the metal foil 212A and the stepwise-curing type adhesive 211A, and the entire region 204 which does not require the metal foil can be detached from the stepwise-curing type adhesive 211A by shredding the region 204 which does not require the metal foil with a metal mold.

Although the embodiment of the present invention has been detailed above with reference to the figures, a tangible structure is not limited to this embodiment, and changes of the structure and the like within a scope that does not depart from the argument of the present invention can also be included.

For example, in a punching method of the metal foil 212A, the burr 212b of the metal foil 212A can be removed by adding a post-process such as etching. Accordingly, a metal foil pattern 212 can be formed having a smooth shape without much irregularity.

When the width of the region 204 which does not require the metal foil (distance between the separating lines C202 and C203) is larger, two or more blade portions can be placed between the blade portions 224 and 225.

The manufactured metal foil pattern 212 can be re-transcribed onto a base material that is not shown in the figures. For a re-transcription, a method for an adhesive transcription, in which a base material is coated with an adhesive, and the like can be used, but is not limited thereto. In addition, by transcribing the metal foil pattern 212 so that the metal foil pattern 212 is embedded inside of an insulating resin, a resin embedding metal wiring can be formed.

A price of metal mold is generally varied depending on the shape and the length of a blade portion, and thus when a number of blade portions are needed to finely shred the region which does not require the metal foil, the length of the blade portion is preferably designed to be as short as possible.

In the above-described embodiment, the distance between the non-detachment region 203a of the region 203 which requires the metal foil and the separating line C203 is longer than the detachment length L200, and by setting this distance to be a value that is twice the detachment length L200, the region 203 which requires the metal foil can be more certainly prevented from being removed together with the region 204 which does not require the metal foil.

In the above-described embodiment, the separating step S203 and the shredding step S204 are performed at the same time. However, the order of these steps is not limited, and thus the shredding step S204 can be performed after the separating step S203, or the separating step S203 can be performed after the shredding step S204. In addition, in the shredding step S204, the region which does not require the metal foil can be cut multiple times.

In the above-described embodiment, cutting can be performed so that the tip 224a of the blade portion 224, the tip 225a of the blade portion 225, and the tip 226a of the blade portion 226 reach the base material 210. In this case, as shown in the FIG. 28, a portion of the base material 210, which contacts with the stepwise-curing type adhesive 211A, is dented after the separating step S203 and the shredding step S204 are performed.

When a cross sectional shape of a planar surface, which is orthogonal to a longitudinal direction, of each of the blade portion 222 used in the preliminary step S201, the blade portions 224 and 225 used in the separating step S203, and the blade portion 226 used in the shredding step S204 is adjusted to be identical, similar effects to those above can be obtained.

After the separating step S203, as shown in the FIG. 26, a portion of the stepwise-curing type adhesive 211A and the region 203 which requires the metal foil are separated from each other, and the space K200 is formed between the stepwise-curing type adhesive 211A and the region 203 which requires the metal foil.

Figure 29:
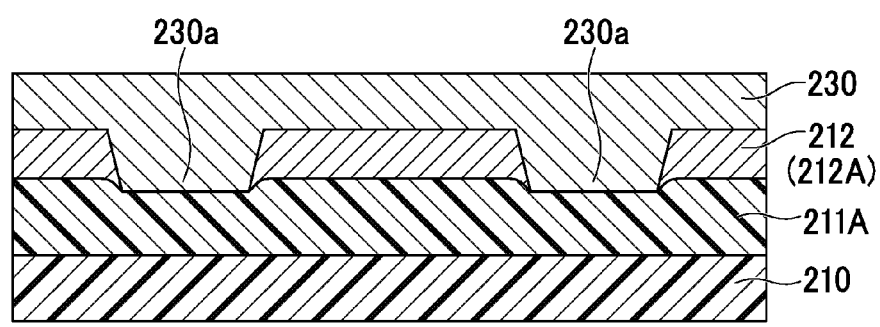
FIG. 29 illustrates a mold release form used in the method of punching a metal foil according to another modified example of the third embodiment.

In the punching method of the metal foil 212A, as shown in the FIG. 29, a depressing step in which the space K200 is filled by depression with the mold release form 230 can be provided after the separating step S203, but before the curing step S205. The mold release form 230 has the convex portion 230a corresponding to the shape of the region 204 which does not require the metal foil. By depressing the stepwise-curing type adhesive 211A with the mold release form 230 from the side of the metal foil pattern 212, the stepwise-curing type adhesive 211A and/or the metal foil pattern 212 is/are deformed to fill the space K200.

Examples of a material composing the mold release form 230 include Teflon (registered trademark) resin, a polyimide resin, a silicone resin, an acrylic resin, and materials of glass molds or metal molds whose surfaces are coated with these resins. Preferably, a material composing the mold release form 230 is not adhered to the stepwise-curing type adhesive 211A, and is easy to release a mold. In the modification example, although the mold release form 230 has the convex portion 230a, the mold release form can be a flat shape not having the convex portion 230a.

By performing the method for punching a metal foil as described above, the space K200 is filled, and detachment of the region 203 which requires the metal foil from the stepwise-curing type adhesive 211A can be more certainly prevented.

A metal electrode is formed on each of a plurality of the adhesive layers that are formed separated from each other so that a continuous adhesive layer does not remain between adjacent metal electrodes, and thus even when a plurality of metal electrodes are formed by cutting a metal foil, a durable and reliable circuit board can be easily manufactured and provided.

Also, a durable and reliable solar cell module can be provided.

In addition, a region which does not require the metal foil can be easily removed from an adhesive film. Also, a region which does not require the metal foil can be easily removed from a stepwise-curing type adhesive.

What is claimed is:

1. A method of manufacturing a circuit board, comprising:
   forming a plurality of metal electrodes so as to be separated from each other on a holding sheet by cutting a metal foil held on the holding sheet to remove a portion of the metal foil;
   forming adhesive layers on surfaces of the plurality of metal electrodes;
   adhering the adhesive layers to a base material by closely contacting the adhesive layers with the base material; and
   transcribing the adhesive layers and the plurality of metal electrodes onto the base material by detaching the holding sheet from the plurality of metal electrodes, wherein
   the portion of the metal foil is removed by
      providing an adhesive layer between the metal foil and the holding sheet,
      cutting the metal foil by punching with a punching blade while forming the plurality of metal electrodes, and
      forming a detachment portion between the metal foil and the adhesive layer on a lateral side of the punching blade when cutting the metal foil, and
   the forming the plurality of metal electrodes comprises
      laminating the metal foil onto the adhesive layer,
      separating a metal region which requires metal foil and a region which does not require metal foil in the metal foil by pushing a tip of the punching blade onto the metal foil to cut the metal foil in a cross section that is parallel to a thickness direction of the metal foil, along a separating line defined by the tip of the pushed punching blade, and by detaching a predetermined area of the metal foil whose center is the separating line from the adhesive layer, shredding the region which does not require the metal foil by pushing a tip of the punching blade onto the region which does not require the metal foil to cut the region which does not require the metal foil in a cross section that is parallel to the thickness direction, along a shredding line defined by the tip of the pushed punching blade, and by detaching a predetermined area of the region which does not require the metal foil whose center is the shredding line from the adhesive layer, and preliminary determining a detachment length, the detachment length is a length of when the metal foil is detached from the adhesive layer by setting a base line as a center, the base line being defined by a tip of a pushed punching blade when the tip of the punching blade is pushed onto the metal foil, the metal foil being laminated on the adhesive layer, in a cross section that is parallel to a thickness direction of the metal foil, and after laminating the metal foil and shredding the region which does not require the metal foil, a distance between the shredding line and the separating line in the cross section that is parallel to the thickness direction is set to be equal to or less than a value twice of the detachment length.

2. The method of manufacturing a circuit board according to claim 1, wherein a minimum value of a distance between the separating lines adjacent to each other is larger than the detachment length at least in a portion of the region which requires the metal foil.

3. The method of manufacturing a circuit board according to claim 1, wherein the tip of the punching blade is formed to have an acute angle.

4. The method of manufacturing a circuit board according to claim 1, wherein the separating the region which requires the metal foil and the region which does not require the metal foil in the metal foil and the shredding the region which does not require the metal foil are performed at the same time.

* * * * *